(12) United States Patent
Falicoff et al.

(10) Patent No.: US 7,874,704 B2
(45) Date of Patent: Jan. 25, 2011

(54) LED LUMINANCE-AUGMENTATION VIA SPECULAR RETROREFLECTION, INCLUDING COLLIMATORS THAT ESCAPE THE ÉTENDUE LIMIT

(76) Inventors: Waqidi Falicoff, 24979 Constitution Ave., Apt. 1138, Stevenson Ranch, CA (US) 91381; Julio C. Chaves, Calle Ortiz Compos 5, Portal 1, 2A, Madrid (ES) 28026; Pablo Benitez, Calle Villa de Marin 37, 8A, Madrid (ES) 28029; Juan Carlos Miñano, Calle Santa Cruz de Marcenado 31, 7, Madrid (ES) 28015; William A. Parkyn, Jr., 2531 Neko Dr., Lomita, CA (US) 90717

( * ) Notice: Subject to any disclaimer, the term of this patent is extended or adjusted under 35 U.S.C. 154(b) by 245 days.

(21) Appl. No.: 12/154,383

(22) Filed: May 21, 2008

(65) Prior Publication Data
US 2008/0291682 A1    Nov. 27, 2008

Related U.S. Application Data

(60) Provisional application No. 60/931,318, filed on May 21, 2007.

(51) Int. Cl.
*F21V 3/00*    (2006.01)
(52) U.S. Cl. .......................... 362/311.12; 362/296.01; 362/297; 362/310; 362/341; 362/346
(58) Field of Classification Search ............ 362/296.01, 362/296.06–296.07, 297, 310, 301–302, 362/311.12, 341, 346; 257/98–99
See application file for complete search history.

(56) References Cited

U.S. PATENT DOCUMENTS

| | | | |
|---|---|---|---|
| 5,684,354 A | 11/1997 | Gleckman | |
| 5,892,325 A | 4/1999 | Gleckman | |
| 6,043,591 A | 3/2000 | Gleckman | |
| 6,496,237 B1 | 12/2002 | Gleckman | |
| 6,639,733 B2 | 10/2003 | Minano et al. | |
| 6,730,940 B1 | 5/2004 | Steranka et al. | 257/98 |
| 6,869,206 B2 | 3/2005 | Zimmerman et al. | |
| 6,896,381 B2 | 5/2005 | Benitez et al. | |

(Continued)

OTHER PUBLICATIONS

David R. Mills and John E. Giutronich, *Three-dimensional Ideal Concentrators for Distant Sources*, Optics Communications, vol. 28(3), pp. 268-274 (Mar. 1979), reprinted in Roland Winston, Ed., *Selected Papers on Nonimaging Optics*, SPIE Milestone Series vol. MS 106, 1995, pp. 226-232.

(Continued)

*Primary Examiner*—Sandra L O Shea
*Assistant Examiner*—Meghan K Dunwiddie
(74) *Attorney, Agent, or Firm*—Drinker Biddle & Reath LLP

(57) ABSTRACT

The diffuse reflectivity of an LED source is utilized to recycle some of its emission, thereby enabling a luminaire to escape the étendue limit. Retroreflectors intercept the rays destined for the outer part of the luminaire aperture, which can then be truncated. The resulting smaller aperture has the same beam-width as the full original, albeit with lesser flux due to recycling losses. A reduction to half the original area is possible.

20 Claims, 15 Drawing Sheets

U.S. PATENT DOCUMENTS

| | | |
|---|---|---|
| 6,960,872 B2 | 11/2005 | Beeson et al. |
| 7,006,306 B2 | 2/2006 | Falicoff et al. |
| 7,025,464 B2 | 4/2006 | Beeson et al. |
| 7,040,774 B2 | 5/2006 | Beeson et al. |
| 7,152,985 B2 | 12/2006 | Benitez et al. |
| 7,181,378 B2 | 2/2007 | Benitez et al. |
| 2006/0239006 A1 | 10/2006 | Chaves et al. ............... 362/294 |
| 2006/0285332 A1 | 12/2006 | Goon et al. ................. 362/327 |
| 2007/0263298 A1 | 11/2007 | El-Ghoroury et al. ....... 359/726 |
| 2008/0074752 A1 | 3/2008 | Chaves et al. ............... 359/641 |
| 2010/0038663 A1 | 2/2010 | Benitez et al. ................ 257/98 |

OTHER PUBLICATIONS

D. Cooke et al., *Sunlight brighter than the Sun*, Nature, vol. 346, p. 802 (Aug. 30, 1990).

W.T. Welford and R. Winston, *High Collection Nonimaging Optics*, equation (2.8) on p. 25 (1989).

Ari Rabl, *Comparison of Solar Concentrators*, Solar Energy, vol. 18, pp. 93-111 (1976), reprinted in *Selected Papers on Nonimaging Optics*, pp. 62-80.

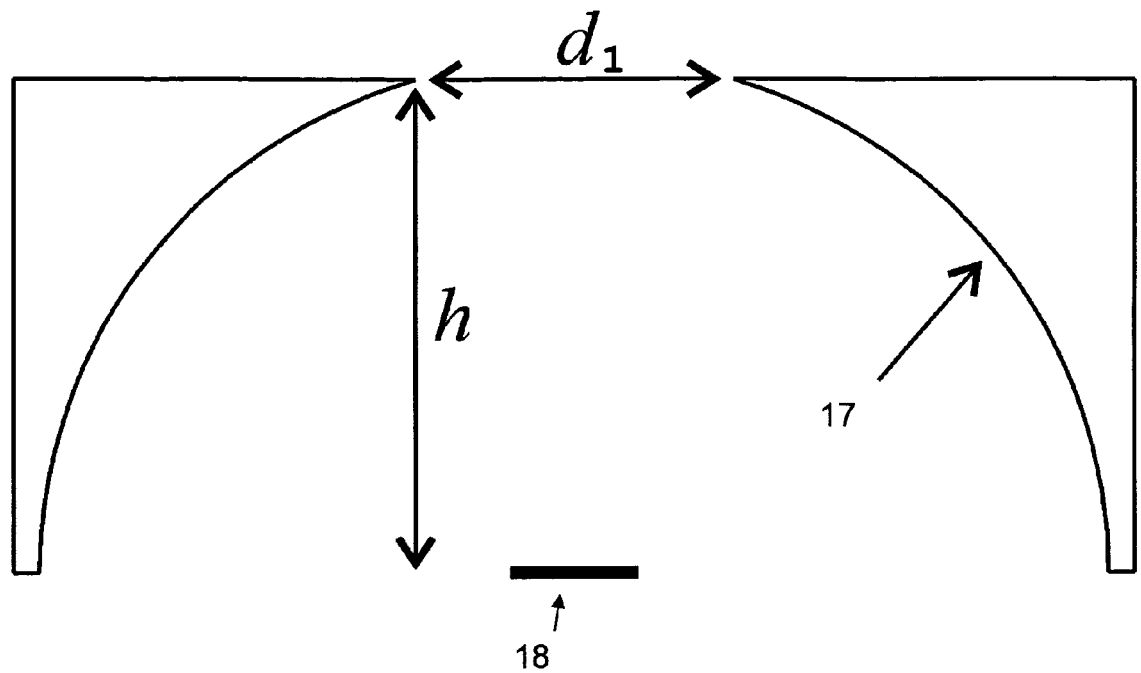
Fig 7
Fig 8
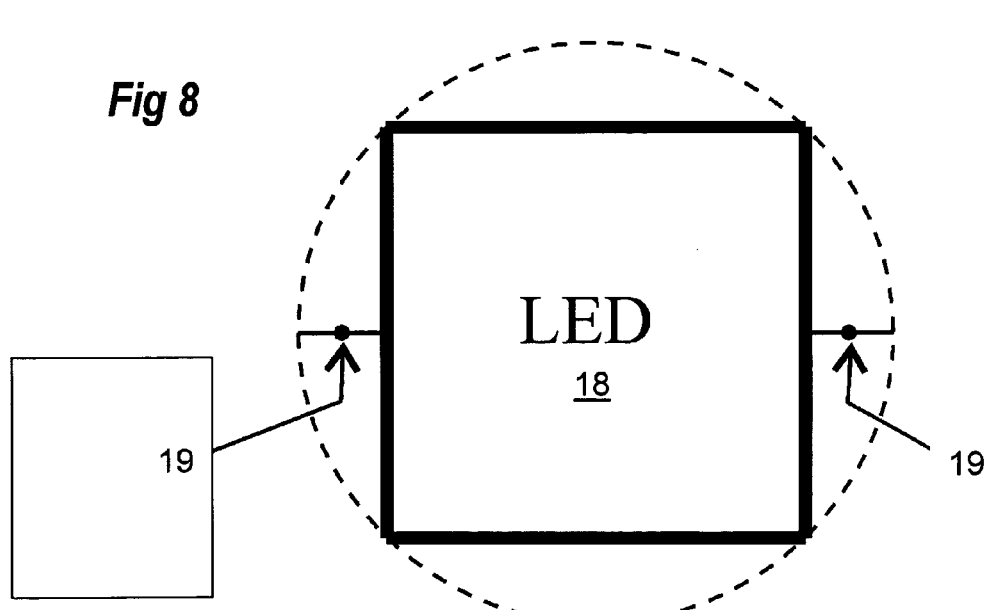

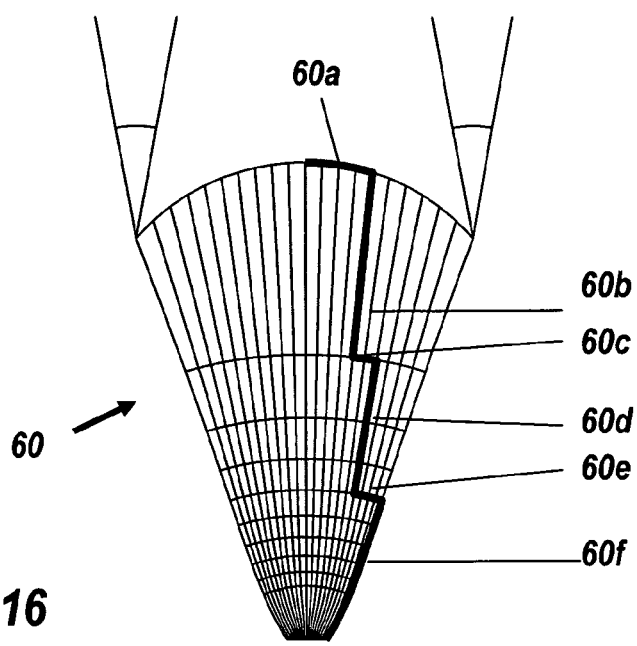
FIG. 16
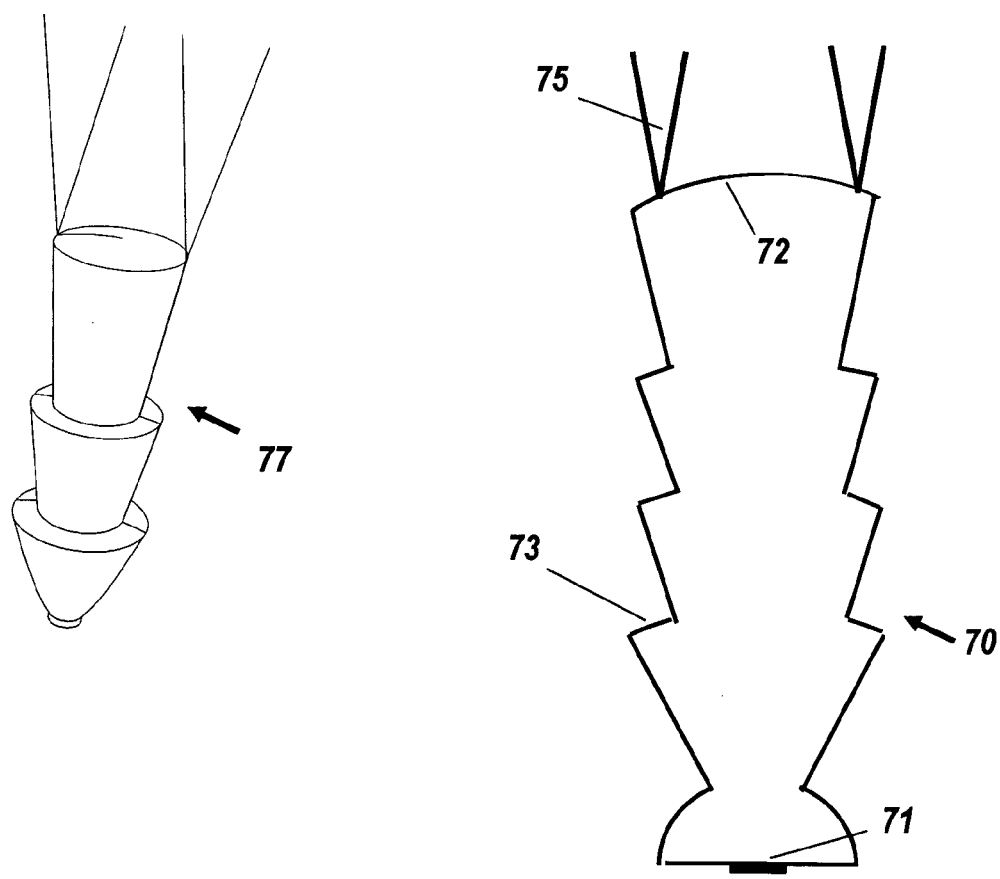
FIG. 18
FIG. 19

LED LUMINANCE-AUGMENTATION VIA SPECULAR RETROREFLECTION, INCLUDING COLLIMATORS THAT ESCAPE THE ÉTENDUE LIMIT

BACKGROUND OF THE INVENTION

The present invention relates generally to beam-forming illumination systems, and more specifically to those with sufficiently narrow solid angles for the output beam to be called collimators. Examples are flashlights and searchlights. The primary limitation upon their performance is étendue-invariance, by which the angular radius θ of the beam is determined by the ratio of source diameter d to aperture diameter D: $\sin \theta = d/D$, when the source radiates into a hemisphere. The beamwidth is twice the angular radius and usually is defined as full width at half maximum (FWHM).

Light emitting diodes (LEDs) are an example of such a hemispheric source. Their small size and ever-improving luminous efficacy are propelling them into market predominance in many fields of lighting. Since their hemispheric emission is too wide for most lighting tasks, LEDs are installed in luminaires that generate narrower output angles. So far, LED flashlights are gaining market prominence, and LED downlights are being installed in ceiling receptacles. Automotive headlights in particular are and example of a field where market pressure for device compactness collides with the étendue theorem. The present luminaires can augment LED brightness, and some embodiments can achieve aperture widths only half the étendue-limited size, with only a modest sacrifice in overall output flux.

SUMMARY OF THE INVENTION

The present luminaires relate generally to collimating illumination optics, and more particularly, but not exclusively, to the small minority of optics with a beamwidth that is largely uniform across the aperture. Different parts of the output beam are generated by light emitted at different off-axis angles by the source. Collimators that suffer from comatic aberration, such as the parabola and the Fresnel lens, have a beamwidth that is wider at the center of the output aperture than at the edge. In contrast, there are several collimators with constant beamwidth across the aperture, including the compound parabolic concentrator (CPC). Three more such constant-beamwidth collimators are the subjects of the following US Patents, which have the same assignee as the present invention and are herein incorporated by reference:
  1. U.S. Pat. No. 6,639,733 to Miñano et al.
  2. U.S. Pat. No. 6,896,381 to Benitez et al., including the subsequent augmentations in U.S. Pat. Nos. 7,152,985 & 7,181,378)
  3. U.S. Pat. No. 7,006,306 to Falicoff et al.

The present luminaires exploit the reflectivity of light emitting diodes (or other light sources) relative to external illumination. In particular, an LED will diffusely reflect illumination from the retroreflection of its own emission. In each of the listed collimators, light going towards the outside of the aperture is specularly retroreflected back to the LED. The reflectivity of a phosphor-conversion white LED at longer wavelengths can be as much as 90%. The reflectivity of a blue LED reflecting blue light may typically be around 70%. The reflection of retroreflected radiation at the source, and the consequent radiance increase, are not in contradiction with Kirchhoff's law of thermal radiation for several reasons, among which are the non-equilibrium and the non black body nature of the whole LED.

This LED diffuse-reflectivity acts to recycle the retroreflected light, so that some of the light then goes out through the restricted exit aperture and the rest is retroreflected yet again. Each cycle of retroflection adds to the LED's original luminance, albeit with decreasing returns.

LED recycling in the prior art utilizes the diffuse reflectivity of nearby surfaces, as in a white-walled cavity, with not much role for the LED's own reflectivity. The present luminaires, however, use retroreflectors, which use specular reflection or operate via total internal reflection (TIR), to return light only to the LED or other light source. In many configurations, the LED or other light source reflects this returned light in a diffusely scattering manner so that some of it scatters into the restricted aperture. The use of specular recycling in the prior art involved large specular mirrors which shined light through the source, particularly the windings of a coiled incandescent filament or the transparent gas of an arc lamp. In contrast, the much smaller size and hemispheric operation of LEDs calls for the novel configuration disclosed herein.

When a constant-beamwidth collimator is cut to half its original aperture diameter, only about ¼ of the LED's flux will be directly transmitted. Call this the transmission fraction $f_T$, so that the amount retroreflected is $1-f_T$. Of course, a real collimator is not 100% efficient to start with, having instead a transmittance T, usually 85% for the listed collimators, of a ray's original energy surviving to emerge through the exit aperture. A metallic coating for the retroreflector will typically have a reflectivity of at most 88%, at least in standard commercially available second-surface mirror coatings. Call this $\rho_r$. It is possible that more expensive multi-layer mirror coatings can be as much as 98% efficient, and their extra cost may be worth it.

Beyond the efficiency of retroreflection, various optical errors will cause some of this light to miss the LED, generating an intercept efficiency $\rho_I$, typically of up to about 90%. In some of the preferred embodiments disclosed herein, this value is nearly 100%. An LED's diffuse reflectivity, $\rho_L=85\%$ for a white LED, overlays this return light on the LED's original emission, enhancing the apparent brightness of the LED.

For each lumen produced by the LED, the fraction $Tf_T$ is emitted by the aperture in a first pass. The fraction $(1-f_T)\rho_r\rho_I$ is returned to the LED, whence it is reflected so that the fraction $F_R=(1-f_T)\rho_r\rho_I\rho_L=50.5\%$ joins the original emission. The infinite-series summation of this recycling, in accordance with the well-known identity, $$a\sum_{n=0}^{\infty} r^n = \frac{a}{1-r},$$

results in a total emission out the aperture of $F_e=Tf_T/(1-F_R)=40\%$. This is a considerable sacrifice to pay for cutting the aperture diameter in half, suggesting a less ambitious reduction. For example, a 29% reduction in aperture diameter (50% area) results in $f_T=50\%$ and $F_e=64\%$, a less onerous outcome.

In a more favorable case, $\rho_r=98\%$ and $\rho_I=98\%$, we have $F_R=61\%$ for an aperture that is 25% the original area (50% of the original diameter), giving $F_e=54\%$, and for a 50% area aperture, $F_R=41\%$ and $F_e=71\%$. These improved efficiencies could justify the extra expense of the superior retroreflective efficiency.

Although each recycling piles a 9% addition on the LED's heat load, or 9%/(1−$F_R$)=18% in all, the LED's heat load to start with is about 2.5 times its light emission, so this extra heat is not a concern. The primary concern, of course, is the cost expressed by $F_e$. Recent trends in LED efficacy, however, have pushed from last year's 40-60 lumens per Watt (LPW) to current 100 LPW, with LED manufacturers predicting that outputs of 140 LPW will be available by the year 2009. Thus an automotive LED headlamp with half the étendue-invariant area would in spite of a one-third loss draw much less current than the larger incandescent lamp it outshines.

Many of the present luminaires can be categorized into two main types of collimator apparatus. The first type of collimator increases the source's effective luminance (and the étendue of the exit aperture of the device) but the overall size of the optic or diameter of the optical system, including the retroreflecting features, is approximately the same as a standard collimator with the same source. The second type of collimator increases the effective luminance of the source but also decreases the diameter of the optical system compared to the "standard" optic. In this case the diameter of the new optic will be smaller than the standard optic that achieves the same degree of collimation with the same source. Both these apparatus escape the classical étendue constraints, but the second type has the advantage over the first that the diameter of the overall system (not just the optical exit aperture) is reduced. Therefore the second type of apparatus should be useful for such applications as automotive forward or rear lighting, where frontal real estate on the vehicle is scarce but luminous performance cannot be compromised. Virtually all of the embodiments disclosed herein are of the second type, but the principles taught also can be applied to those of the first type.

The two types of collimator apparatus can be further divided into two sub-categories. There is the case where the retroreflection features are close to (or proximal) the source and the collimation feature is remote from the source. One example of this type of apparatus is shown in FIG. 9, where lens 22 is farther away from the source than the retroreflectors 23. In the second sub-category the retroreflectors are not proximate to the source and can be further away than the nearest points on the exit surface of the optic. An example of this type of collimator is illustrated in FIG. 21.

In one embodiment, there is provided a collimating luminaire comprising a light-source with a diffuse reflectivity exceeding one half. A collimator intercepts the emitted light of the source. The collimator produces a beamwidth across its exit aperture that is preferably substantially uniform, and a system of retroreflectors returns part of the emitted light to the source. The retroreflectors allow the removal of an outer part of the exit aperture, so that the remaining exit aperture is smaller than the étendue-limited aperture for the beamwidth in question.

In another embodiment, there is provided a collimating luminaire comprising a light-source with a diffuse reflectivity exceeding one half, the luminaire defining an exit aperture and intercepting the emitted light of the source in directions outside the exit aperture. The luminaire comprises at least one at least approximately elliptically concave retroreflector that returns part of the emitted light to the source.

In a further embodiment, there is provided a collimating luminaire comprising a light-source with a diffuse reflectivity exceeding one half, and a collimator intercepting the emitted light of the source. The luminaire produces a substantially uniform beamwidth across its exit aperture, and a system of forward reflectors directs part of the emitted light to the exit aperture. The system of reflectors allowing the removal of the outer part of the exit aperture, so that the exit aperture is smaller than the étendue-limited aperture for the beamwidth.

In another embodiment, there is provided a combined collimator and retroreflector that can be combined with a suitable light source to form a luminaire embodying the invention.

At least one focus of an ellipse defining the elliptically concave retroreflector may be at least approximately at an edge of a beam of light that reaches the retroreflector from the source. At least one focus of the ellipse may then be at least approximately at an edge of the light source.

At least one focus of the ellipse may be at least approximately at an edge of an opaque object that cuts off the beam of light. If the luminaire comprises at least two said retroreflectors, at least one focus of the ellipse defining a first retroreflector may be at least approximately at an edge of a second retroreflector between the source and the first retroreflector.

The luminaire may comprise at least one forward reflector positioned to direct intercepted light through the exit aperture in such a manner as to produce a substantially uniform beamwidth across the exit aperture wherein the exit aperture is smaller than the étendue-limited aperture for the beamwidth.

At least one forward reflector may be at least approximately hyperbolically concave. At least one focus of a hyperbola defining the hyperbolically concave forward reflector may then be at least approximately at an edge of a beam of light that reaches the forward reflector from the source. At least one focus of the hyperbola may be at least approximately at an edge of the light source. At least one focus of the hyperbola may be at least approximately at an edge of at an edge of an opaque object that cuts off the beam of light, and the opaque object may then be an edge of a said retroreflector between the source and the forward reflector. The retroreflectors may operate in air. The retroreflectors may operate inside a dielectric.

The retroreflectors may reflect by micro-linear grooves. The retroreflectors may reflect by a thin film stack. The thin film stack may have an initial layer of a low index of refraction material with a thickness approximately equal to two times the nominal wavelength for stack.

BRIEF DESCRIPTION OF THE DRAWINGS

The above and other aspects, features, and advantages of the present invention will be more apparent from the following more particular description thereof, presented in conjunction with the following drawings wherein:

FIG. 7 is a cross-sectional view of the exemplary elliptical reflector used to generate the graph of FIG. 6.

FIG. 8 is a plan view of the position of the foci for elliptical reflector of FIG. 7.

FIG. 16 shows a family of flowlines and ortho-flowlines in a DTIRC showing the boundary lines for a three-tier retroreflector drawn to scale.

FIG. 18 is a perspective view of a DTIRC with three-tiers of retro-reflectors drawn to scale.

FIG. 19 shows a further embodiment with flowline retroreflectors having five tiers.

DETAILED DESCRIPTION OF THE EMBODIMENTS

Figure 1:
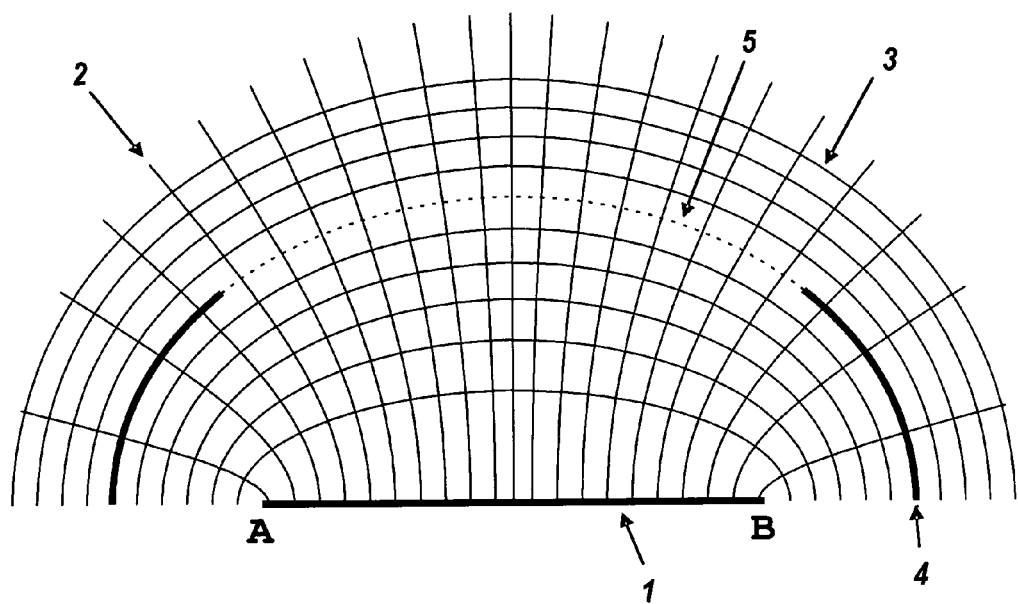
FIG. 1 shows for a flat Lambertian light source the hyperbolic flowlines and the elliptical "ortho-flowlines," which are curves everywhere orthogonal to the flowlines.

A better understanding of various features and advantages of the present luminaires will be obtained by reference to the following detailed description of the invention and accompanying drawings, which set forth illustrative embodiments. Corresponding reference characters indicate corresponding components throughout the several views of the drawings.

Flowlines are well known in the field of non-imaging optics, being defined at any point receiving light from a source. At some viewing point, rays are received from across the source, and the rays from the source's edges define the edge of the source image. In the case of the following Figures, the flowlines are everywhere tangent to the bisectors of the angle formed by the rays from the two edges of the source.

FIG. 1 is a two-dimensional view across a light source 1, emitting upwards between point A and point B. Flowlines 2 are confocal hyperbolas with those points A and B as their foci. At every point upon the flowlines 2, the local tangent is the bisector of the lines to points A and B. The lines 3, referred to herein as "ortho-flowlines," are defined as the family of lines that are everywhere orthogonal to the flowlines 2. In FIG. 1, the ortho-flowlines 3 are confocal ellipses. In general, the shape of the ortho-flowlines is determined by the shape and distribution of the flowlines. In particular, elliptical segments 4 of one of the confocal ellipses 3 form a light barrier extending from the plane of light source 1, with a dotted line 5 denoting a central aperture between the barrier segments 4.

Figure 2:
FIG. 2 shows reflectors that do not alter the flowlines.

FIG. 2 shows the source 1 extending between points A and B, with elliptical specular reflectors 6 and 8 lying on two of the confocal ellipses of FIG. 1 and joined by hyperbolic specular reflectors 7 lying on hyperbolic flowlines of FIG. 1. Because they lie on the flowlines, the reflectors 6, 7, 8 do not alter the fundamental character of the light field of source 1, but merely return some of the radiation from source 1 back to source 1. When source 1 is reflective, and especially when source 1 is diffusely reflective, some of the returned light will be radiated upwards, missing reflectors 6, 7, 8 and adding to the luminance of source 1 emerging through aperture 5. Light emitting diodes have a diffuse reflectivity, making possible the present luminaires.

Figure 3:
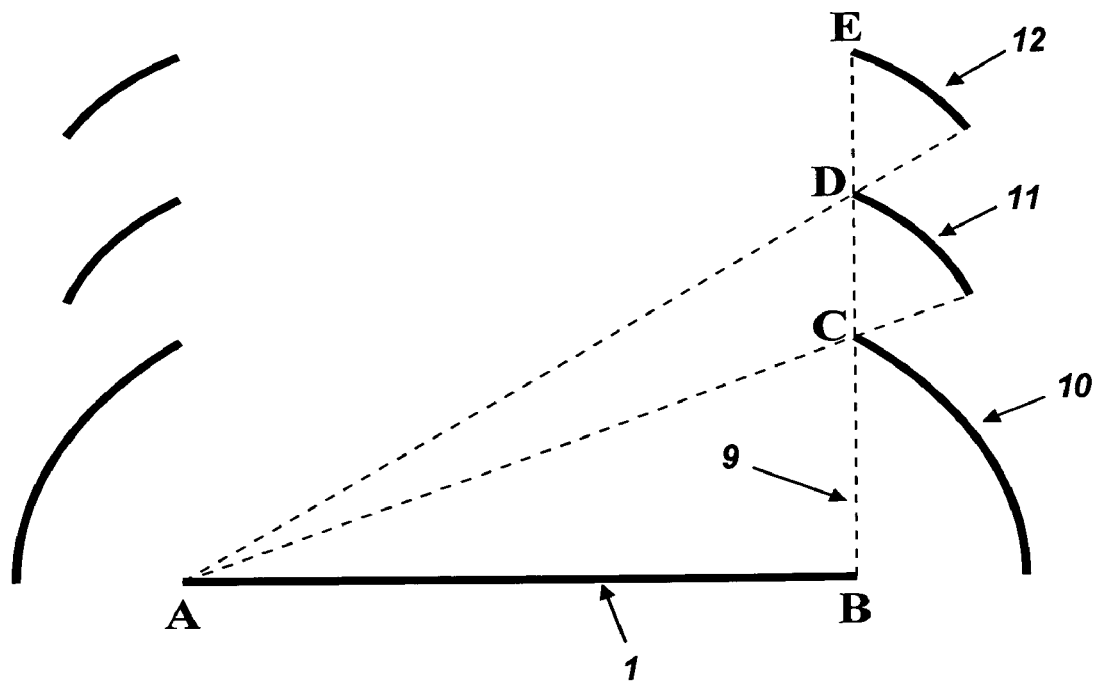
FIG. 3 shows an alternative deployment of elliptical reflectors.

FIG. 3 shows horizontal source 1 extending between points A and B, and exemplary vertical dotted line 9 proceeding upward from point. B. Elliptical arc reflector 10 has its foci on points A and B, and terminates at its inner end upon line 9 at point C. Above reflector 10 is disposed elliptical arc reflector 11 with foci on points A and C, and terminating at its inner end upon line 9 at point D. Above reflector 11 is disposed elliptical arc reflector 12, which has foci on points A and D and terminates on line 9 at point E. This system of reflectors is less sensitive to fabrication errors than that of FIG. 2.

Figure 4:
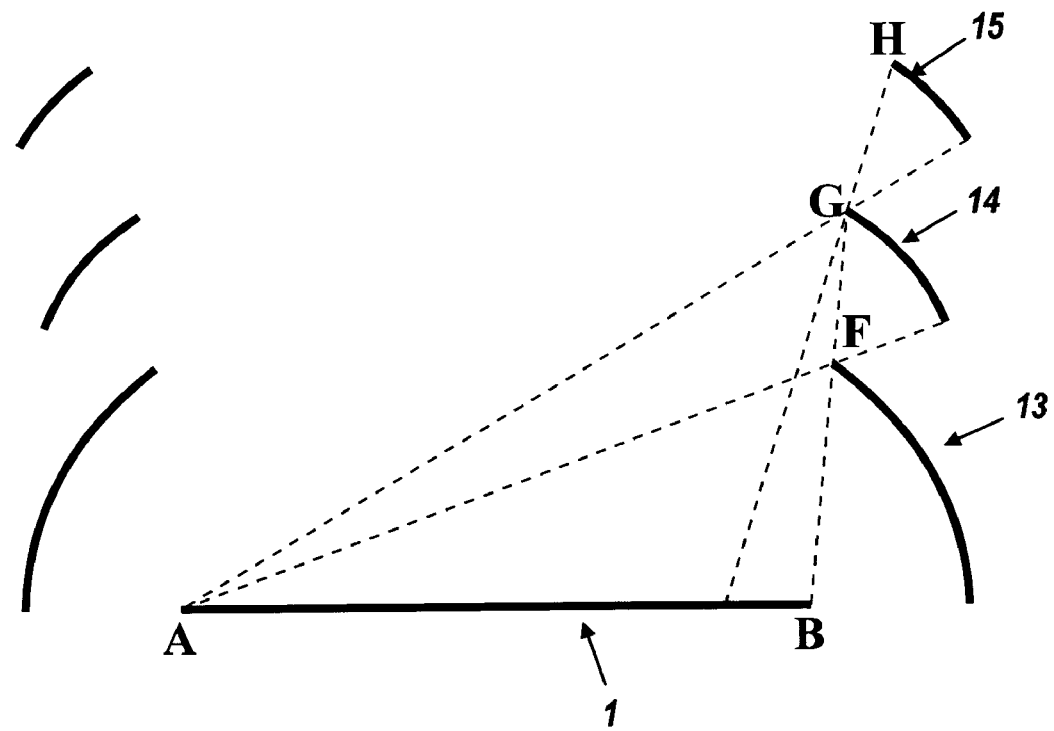
FIG. 4 shows yet another alternative deployment of elliptical reflectors.

FIG. 4 also shows source 1 extending between points A and B, and reflectors 13, 14, and 15 with terminating points and foci F, G, & H analogous to points C, D, & E in FIG. 3. However, points F, G, & H are not collinear, unlike points C, D, & E in FIG. 3.

Figure 5:
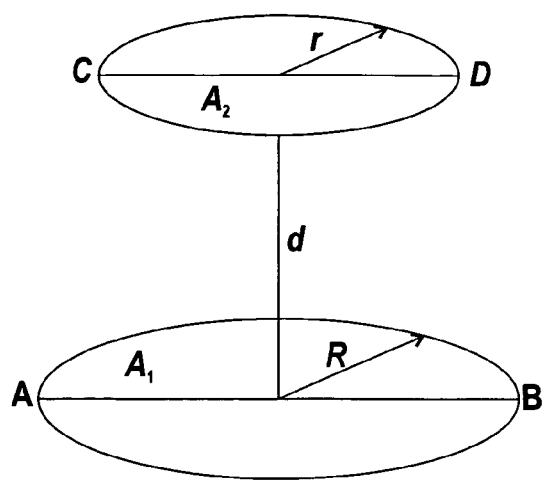
FIG. 5 shows a circular area $A_1$ with radius R and another circular area $A_2$ with radius r, a distance d apart.

FIG. 5 shows a circular area $A_1$ with radius R and another circular area $A_2$ with radius r. Circular areas $A_1$ and $A_2$ are coaxial and a distance d apart. Points A, B are diametrically opposed points on the boundary of area $A_1$. Points C', D' are diametrically opposed points on the boundary of area $A_2$, with D' the nearest point to B and C' the nearest point to A. If $A_1$ is a source of light and $A_2$ is an aperture through which light from $A_1$ escapes, the étendue of that light is given by $U=n^2(\pi/4)([A,D']-[A,C'])^2$ where [X,Y] denotes the distance between X and Y and n the refractive index of the medium in which $A_1$ and $A_2$ are immersed. If $A_1$ is a Lambertian source, the étendue it emits is $U_1=\pi n^2 A_1$. An ideal optic that recirculates through $A_1$ the light emitted by $A_1$, in such a way as to force this radiation to come out through area $A_2$, will then also reduce the étendue of the radiation by a factor of $U/U_1$. The luminance of the emitted light will increase accordingly.

Figure 6:
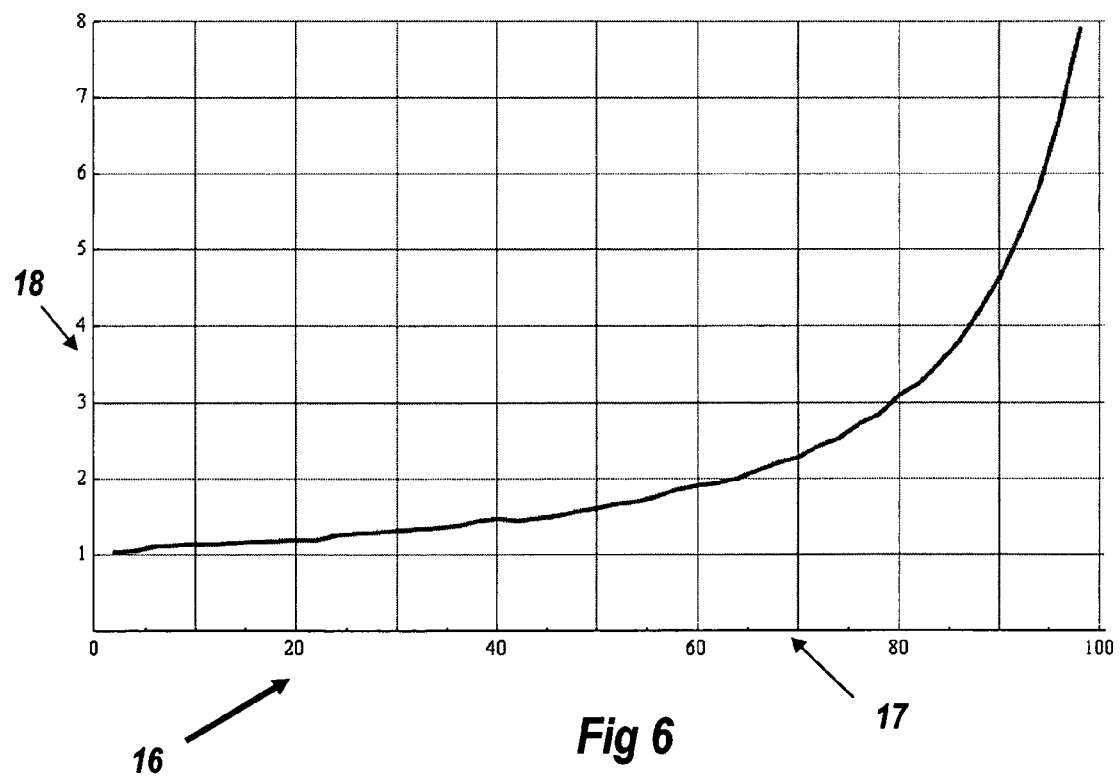
FIG. 6 shows a graph of the theoretical increase in brightness for an exemplary elliptical reflector of the embodiment of FIG. 1 as a function of LED reflectivity.

FIG. 6 shows the theoretical brightness increase of an elliptical reflector based on embodiment of FIG. 1. FIG. 6 shows graph 16 with horizontal axis 17, representing the reflectivity of the LED in % varying from 0 to 100%, and vertical axis 18, representing the fractional increase in brightness of the LED light source. It is assumed that the average reflectivity of the surfaces of the elliptical reflector is 98%. For an average LED reflectance of 70% there is an increase in brightness by a factor of just over two from the original LED. As modern LEDs have reflectivity in the visible spectrum approximately 70% this indicates that a two-fold luminance increase should be attainable.

FIG. 7 shows an axial cross-section view of the device used in the ray-tracing model that generated the results shown in FIG. 6. The size of exit aperture for the elliptical reflector 17' of FIG. 7 is shown by dimension $d_1$. The height of the exit aperture above the LED 18' is shown by dimension h. FIG. 8 shows in plan view the position of the foci 19' for the elliptical reflector of FIG. 7 relative to the LED.

Figure 9:
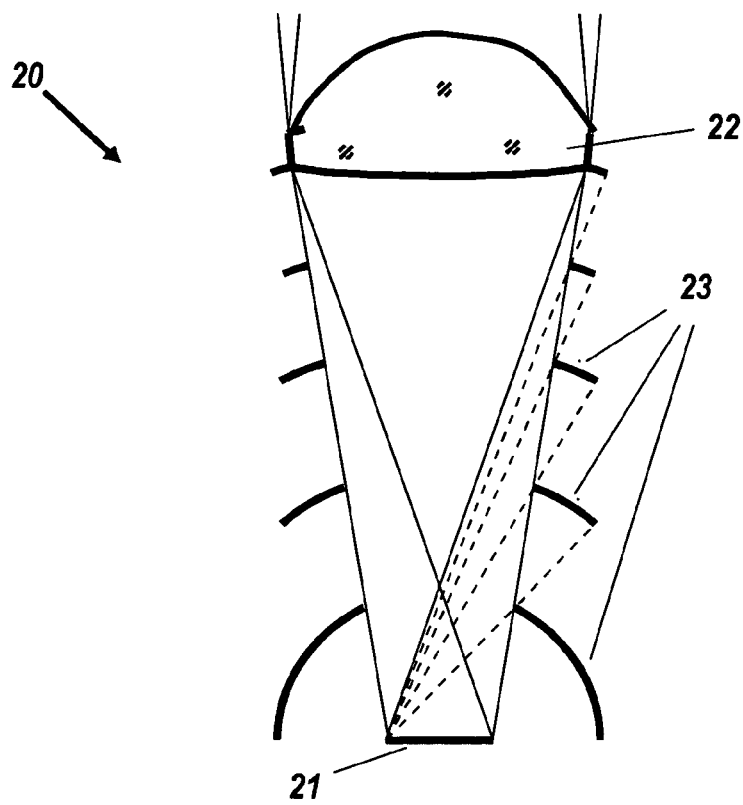
FIG. 9 shows a collimating lens above an array of elliptical mirrors.

FIG. 9 shows a further embodiment of a collimating system 20, comprising flat light source 21, a lens 22 that may be similar to an embodiment shown in the above-referenced U.S. Pat. No. 6,639,733 to Miñano et al., and elliptical mirrors 23 that return light to source 21, enhancing the brightness of source 21 as seen by lens 22.

Figure 10:
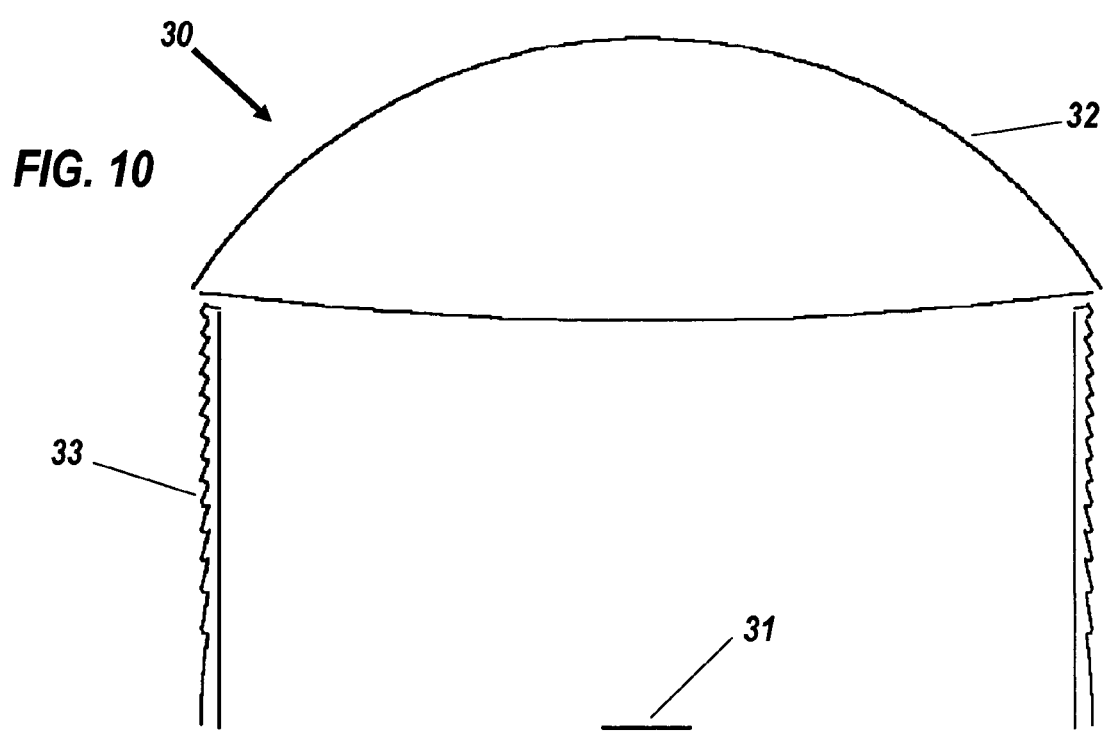
FIG. 10 shows a collimating lens with a mirror-coated, externally grooved cylindrical retroreflector.

FIG. 10 shows an axially symmetric collimating system 30, comprising flat LED source 31, lens 32, and cylindrical sleeve 33 with retroreflecting external facets having a mirror coating. Sleeve 33 causes light source 31 to have enhanced luminance for lens 32.

Figure 11:
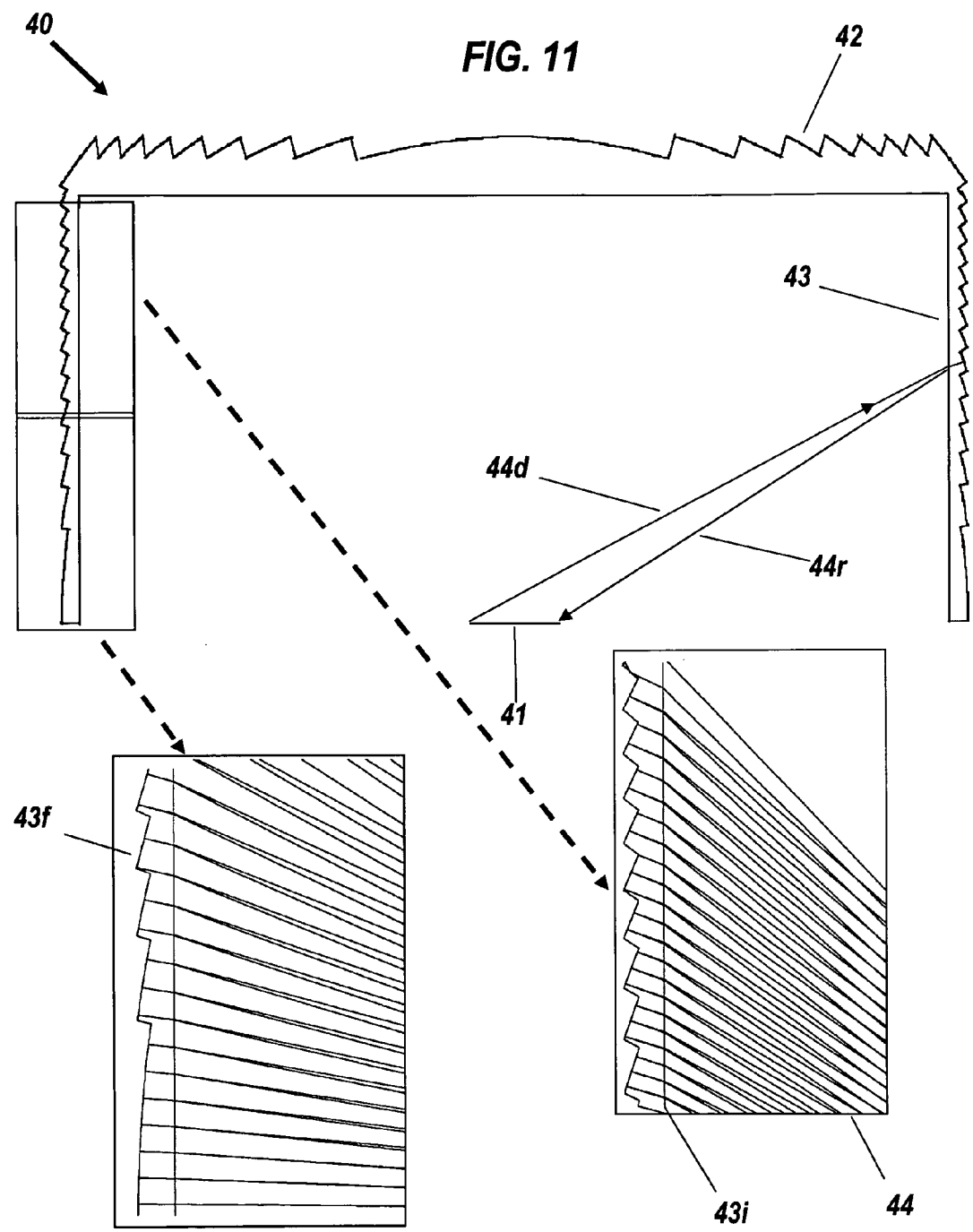
FIG. 11 shows a Fresnel lens with the retroreflector, including close-ups of reflected rays.

FIG. 11 shows a similar collimating system 40, comprising flat LED source 41, collimating Fresnel lens 42, and cylindrical sleeve 43, also shown in two close-up views including edge rays 44, which can be seen being refracted by inner surface 43i and retroreflected by outer faceted surface 43f, a second-surface mirror. In particular, ray 44d proceeds outward from the edge of light source 41 and is reflected as ray 44r back to the opposite edge.

Figures 12, 13, 14:
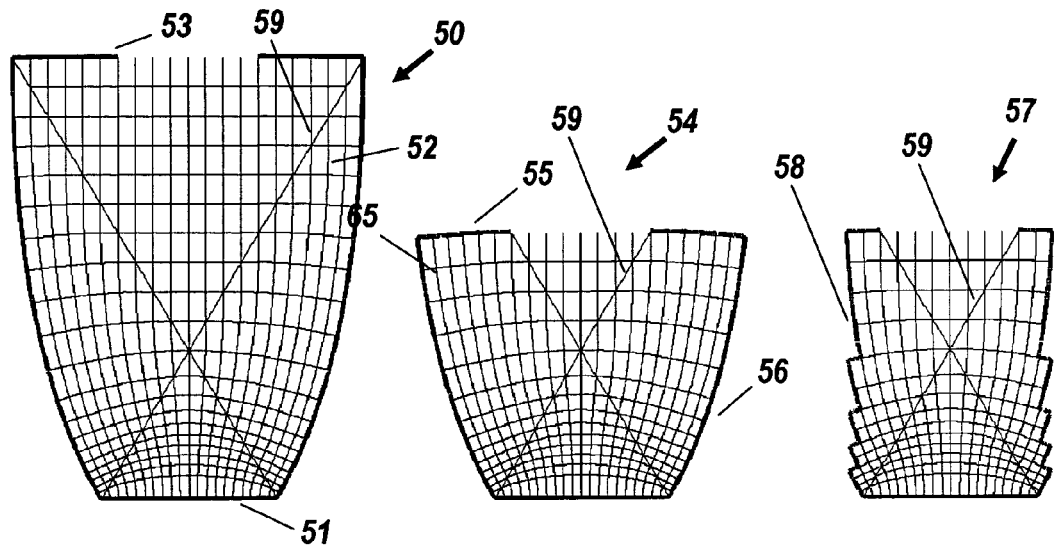
FIG. 12 shows a CPC with flowlines and ortho-flowlines.
FIG. 13 shows how the CPC's aperture is restricted, with étendue-limited beamwidth unchanged.
FIG. 14 shows how the CPC's width is reduced.

FIG. 12 shows a compound parabolic concentrator (CPC) 50, with flat light source 51 and flowlines 52. Annular reflector 53 covers part of the CPC exit, returning light to source 51. Edge rays 59 show the angular beamwidth of CPC 50 before the beamwidth is reduced by reflector 53.

FIG. 13 shows truncated CPC 54, with annular reflector 55 following a line normal to the flowline curves. Reflective parabolic surface 56 between light source 51 and reflector 55 in FIG. 13 corresponds to the bottom half of the parabolic surface in FIG. 12. Edge rays 59 in FIG. 13 are at the same beamwidth angle as edge rays 59 in FIG. 12, but bound the actual beamwidth passing through the central aperture of reflector 55.

FIG. 14 shows more truncated CPC 57, replacing smooth parabolic profile 56 of FIG. 13 with Fresnel retroreflector 58. Edge rays 59 show that all three configurations have the same beamwidth as the original CPC, in spite of their smaller apertures.

Figures 15, 17:
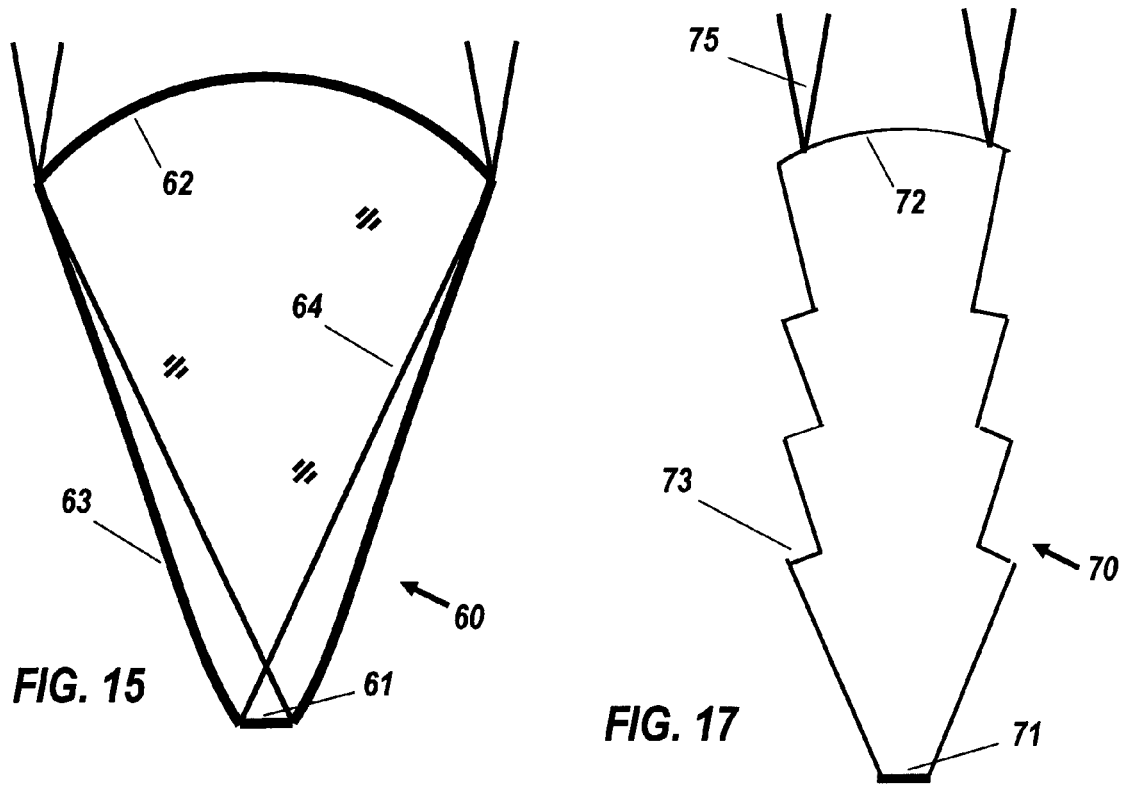
FIG. 15 shows a dielectric total internally reflecting concentrator (DTIRC).
FIG. 17 shows a DTIRC with flowline retroreflectors having four tiers.

FIG. 15 shows a cross-section of dielectric total internally reflecting concentrator (DTIRC) 60, comprising immersed LED source 61, aspheric exit surface 62, and totally internally reflecting quasi-conical side wall 63. Edge rays 64 are refracted at exit surface 62 into étendue-limited beamwidth 65.

FIG. 16 shows DTIRC 60 of FIG. 15 with a family of flowlines inside its dielectric medium which are drawn to scale. Also shown are the flowlines and ortho-flowlines chosen from a family of lines to form the boundary curves for a three-tier retroreflector. The six boundary curves for the retroreflector are shown starting from the top of the cross-sectional view of the original DTIRC and are labeled 60a (an ortho-flowline), 60b (a flowline), 60c (an ortho-flowline), 60d (a flowline), 60e (an ortho-flowline) and 60f (a flowline). These curves are used to create the retroreflector shown in FIG. 18. This is done by sweeping the set of boundary curves about the central axis of the DTIRC optic. Note that the boundary curves are all attached to each other. Also it is possible to create a different family of flowlines and ortho-flowlines inside the DTIRC than the ones drawn in FIG. 16. A new retroreflector can be created from the new orthogonal sets of lines by choosing any paired set (one flowline and an attached ortho-flowline) of attached boundary curves that connect along length of the original optic. Any number of design solutions is possible using this flexible approach.

FIG. 17 shows a cross section of dielectric retroreflective collimating system 70 having four tiers, comprising immersed LED source 71, truncated aspheric exit surface 72, and retroreflective mirror-coated faceted sidewall 73. Beamwidth 75 is the same as beamwidth 65 of FIG. 15, in spite of the reduced aperture of exit surface 72 compared with exit surface 62.

FIG. 18 is a perspective view of a three tier retroactive collimating system 77 based on the flowlines and ortho-flowlines for DTIRC 60 of FIG. 16. The boundary curves for an axial section of collimating system 77 are marked in bold line on FIG. 16 The coordinates for the boundary curves for this design are provided in the following Table 1 and Table 2). Table 1 gives the x,y (the y-value is the vertical measurement) coordinates for boundary curves 60a, 60b and 60c, respectively from left to right in the table. Table 2 gives the x,y coordinates for boundary curves 60d, 60e and 60f, respectively left to right.

FIG. 19 shows a cross section of dielectric retroreflective collimating system 70' having five tiers, comprising immersed LED source 71, truncated aspheric exit surface 72, and retroreflective mirror-coated faceted sidewall 73'. Beamwidth 75 is the same as beamwidth 65 of FIG. 15, in spite of the reduced aperture of exit surface 72. The four upper tiers are similar to the collimating system 70 shown in FIG. 17. The tier closest to the LED source 71 is elliptical, and may be centered on the source 71 as described with reference to FIG. 1. In the embodiment of FIG. 19, the sidewall 73' does not cross the LED edges, making easier manufacturing.

The devices shown in FIGS. 12 to 16 may be modified by adding an elliptical bottom tier similarly to FIG. 19.

TABLE 1

| refractive surface 60a | | flowline 60b | | upper reflector 60c | |
| --- | --- | --- | --- | --- | --- |
| x | y | x | y | x | y |
| 0.005601 | 12.53944 | 1.716114 | 12.27004 | 1.210033 | 7.444959 |
| 0.058138 | 12.53914 | 1.667029 | 11.80874 | 1.273561 | 7.438215 |
| 0.11627 | 12.53824 | 1.620984 | 11.37481 | 1.384193 | 7.425573 |
| 0.174389 | 12.53673 | 1.577689 | 10.96568 | 1.493433 | 7.411949 |
| 0.232489 | 12.53462 | 1.536888 | 10.57912 | 1.601198 | 7.397372 |
| 0.290565 | 12.5319 | 1.498357 | 10.21314 | 1.707409 | 7.381869 |
| 0.348609 | 12.52858 | 1.461898 | 9.865984 | 1.81199 | 7.365471 |
| 0.406615 | 12.52466 | 1.427336 | 9.536111 | 1.819595 | 7.364233 |
| 0.464578 | 12.52014 | 1.394513 | 9.222134 | | |
| 0.52249 | 12.51502 | 1.36329 | 8.922821 | | |
| 0.580347 | 12.50929 | 1.333542 | 8.637066 | | |
| 0.63814 | 12.50297 | 1.305155 | 8.363878 | | |
| 0.695865 | 12.49605 | 1.27803 | 8.102362 | | |
| 0.753515 | 12.48852 | 1.252073 | 7.851712 | | |
| 0.811084 | 12.4804 | 1.227203 | 7.611197 | | |
| 0.868565 | 12.47168 | 1.210033 | 7.444959 | | |
| 0.925953 | 12.46237 | | | | |
| 0.983241 | 12.45246 | | | | |
| 1.040423 | 12.44195 | | | | |
| 1.097493 | 12.43086 | | | | |
| 1.154445 | 12.41917 | | | | |
| 1.211272 | 12.40689 | | | | |
| 1.267969 | 12.39402 | | | | |
| 1.324529 | 12.38057 | | | | |
| 1.380946 | 12.36652 | | | | |
| 1.437215 | 12.35189 | | | | |
| 1.493328 | 12.33668 | | | | |
| 1.549281 | 12.32089 | | | | |
| 1.605067 | 12.30452 | | | | |
| 1.66068 | 12.28757 | | | | |
| 1.716114 | 12.27004 | | | | |

TABLE 2

| flowline 60d | | lower reflector 60e | | flowline 60f | |
|---|---|---|---|---|---|
| x | y | x | y | x | y |
| 1.819595 | 7.364233 | 1.240887 | 3.830033 | 1.962563 | 3.654924 |
| 1.810273 | 7.307064 | 1.257388 | 3.827189 | 1.940394 | 3.585854 |
| 1.783886 | 7.145132 | 1.273825 | 3.824306 | 1.896927 | 3.450582 |
| 1.758331 | 6.98816 | 1.290197 | 3.821384 | 1.854616 | 3.319194 |
| 1.733562 | 6.835885 | 1.306502 | 3.818423 | 1.813358 | 3.191447 |
| 1.709536 | 6.688068 | 1.322738 | 3.815424 | 1.773065 | 3.067138 |
| 1.686212 | 6.544483 | 1.338905 | 3.812388 | 1.733658 | 2.946098 |
| 1.663553 | 6.404923 | 1.355001 | 3.809316 | 1.69507 | 2.828184 |
| 1.641524 | 6.269195 | 1.371025 | 3.806208 | 1.657242 | 2.713278 |
| 1.620093 | 6.137118 | 1.386976 | 3.803066 | 1.620121 | 2.60128 |
| 1.59923 | 6.008527 | 1.402852 | 3.799889 | 1.583665 | 2.492107 |
| 1.578906 | 5.883264 | 1.418652 | 3.79668 | 1.547832 | 2.385689 |
| 1.559095 | 5.761184 | 1.434374 | 3.793437 | 1.512589 | 2.281967 |
| 1.539771 | 5.642152 | 1.450018 | 3.790163 | 1.477906 | 2.180894 |
| 1.520913 | 5.526039 | 1.465582 | 3.786859 | 1.443757 | 2.082428 |
| 1.502496 | 5.412728 | 1.481065 | 3.783524 | 1.410119 | 1.986534 |
| 1.484502 | 5.302107 | 1.496465 | 3.78016 | 1.376975 | 1.893184 |
| 1.466911 | 5.194073 | 1.511782 | 3.776768 | 1.344307 | 1.802352 |
| 1.449703 | 5.088527 | 1.527014 | 3.773348 | 1.312103 | 1.714015 |
| 1.432863 | 4.985379 | 1.542159 | 3.769901 | 1.280352 | 1.628155 |
| 1.416373 | 4.884542 | 1.557218 | 3.766429 | 1.249047 | 1.544753 |
| 1.400219 | 4.785937 | 1.572187 | 3.762932 | 1.218181 | 1.463793 |
| 1.384385 | 4.689488 | 1.587067 | 3.759411 | 1.187752 | 1.385258 |
| 1.368857 | 4.595124 | 1.601856 | 3.755867 | 1.157757 | 1.309134 |
| 1.353622 | 4.50278 | 1.616552 | 3.752301 | 1.128198 | 1.235404 |
| 1.338668 | 4.412393 | 1.631156 | 3.748713 | 1.099078 | 1.164051 |
| 1.323982 | 4.323904 | 1.645664 | 3.745106 | 1.070401 | 1.095061 |
| 1.309553 | 4.23726 | 1.660077 | 3.741478 | 1.042174 | 1.028414 |
| 1.295369 | 4.152409 | 1.674393 | 3.737832 | 1.014406 | 0.964093 |
| 1.281421 | 4.069303 | 1.68861 | 3.734169 | 0.987107 | 0.902078 |
| 1.267698 | 3.987899 | 1.702729 | 3.730489 | 0.96029 | 0.842349 |
| 1.254189 | 3.908155 | 1.716747 | 3.726794 | 0.933969 | 0.784884 |
| 1.240887 | 3.830033 | 1.730663 | 3.723083 | 0.90816 | 0.729662 |
| | | 1.744477 | 3.71936 | 0.882881 | 0.676658 |
| | | 1.758187 | 3.715623 | 0.85815 | 0.625849 |
| | | 1.771792 | 3.711875 | 0.83399 | 0.577208 |
| | | 1.785291 | 3.708115 | 0.810422 | 0.53071 |
| | | 1.798683 | 3.704346 | 0.787471 | 0.486328 |
| | | 1.811967 | 3.700569 | 0.765163 | 0.444036 |
| | | 1.825142 | 3.696783 | 0.743525 | 0.403806 |
| | | 1.838206 | 3.692991 | 0.722585 | 0.365612 |
| | | 1.851159 | 3.689193 | 0.702373 | 0.329425 |
| | | 1.864 | 3.685391 | 0.682919 | 0.29522 |
| | | 1.876728 | 3.681584 | 0.664256 | 0.262971 |
| | | 1.889341 | 3.677775 | 0.646417 | 0.232654 |
| | | 1.901839 | 3.673965 | 0.629433 | 0.204246 |
| | | 1.91422 | 3.670154 | 0.613341 | 0.177724 |
| | | 1.926484 | 3.666343 | 0.598172 | 0.153069 |
| | | 1.93863 | 3.662534 | 0.583963 | 0.130265 |
| | | 1.950657 | 3.658727 | 0.570746 | 0.109296 |
| | | 1.962563 | 3.654924 | 0.558556 | 0.090152 |
| | | | | 0.547426 | 0.072823 |
| | | | | 0.537388 | 0.057306 |
| | | | | 0.528472 | 0.043601 |
| | | | | 0.520707 | 0.031712 |
| | | | | 0.514121 | 0.021647 |
| | | | | 0.508738 | 0.013421 |
| | | | | 0.504579 | 0.007054 |
| | | | | 0.501662 | 0.00257 |
| | | | | 0.5 | 8.71E−15 |

Figure 20:
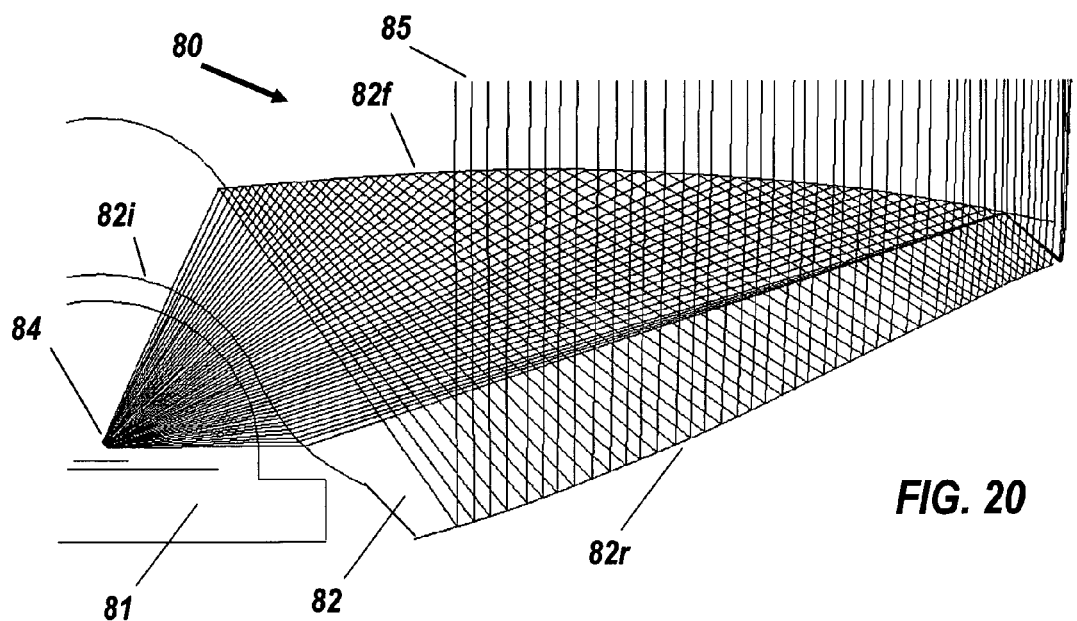
FIG. 20 shows an embodiment similar to one shown in the above-referenced U.S. Pat. No. 6,896,381 to Benitez et al.

FIG. 20 shows a cross-section of airgap RXI collimating system 80, similar to an embodiment shown in the Falicoff '306 patent. LED package 81 is placed at the center of collimating lens 82. Package 81 emits ray-fan 84, which is transformed into étendue-limited collimated beam 85. Lens 82 comprises interior surface 82i receiving ray-fan 84, front surface 82f that totally internally reflects light back downward on a folded path, and mirror-coated rear surface 82r which sends the light back up, whence it exits surface 82f.

Figure 21:
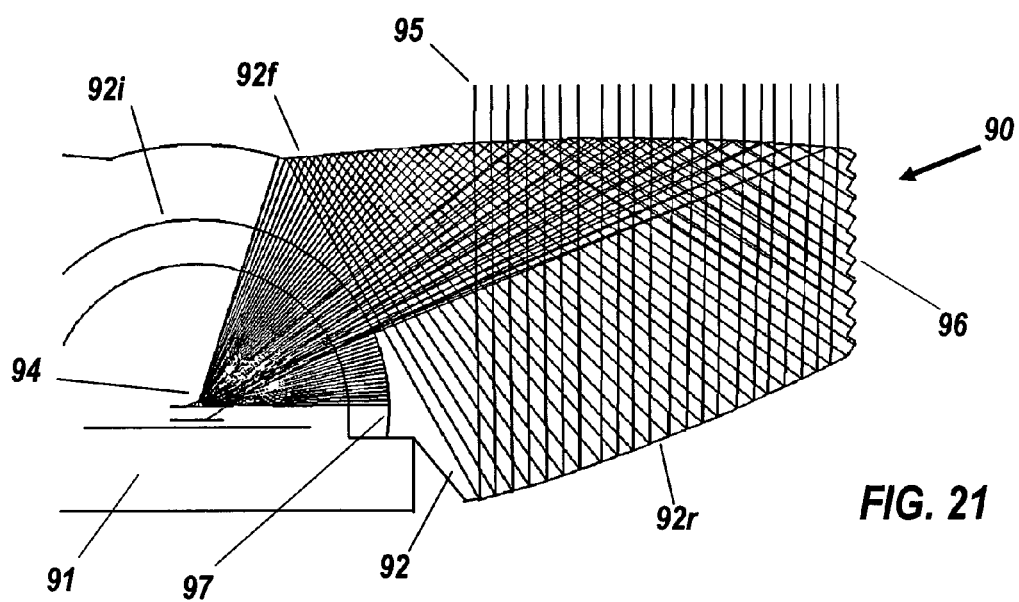
FIG. 21 shows a device similar to that of FIG. 20 truncated by retroreflectors.

FIG. 21 shows a cross-section of truncated airgap RXI collimating system 90, operating with identical LED package 91, and lens 92 that is truncated by vertically disposed retroreflector 96. The part of ray-fan 94 that would strike retroreflector 96 directly is recycled by reflector coating 97 on interior surface 92i of lens 92, so the surface here has a different shape than does surface 82i of FIG. 20. Surfaces 92f and 92r correspond to surfaces 82f and 82r in FIG. 20. Retroreflector 96 thus recycles light from the outer part of internally reflecting surface 92f. Alternatively, the corresponding parts of the exterior surface of the LED 91 can be mirrored. Output beam 95 has the same beamwidth as beam 85 of FIG. 20, in spite of the smaller aperture.

Figure 22:
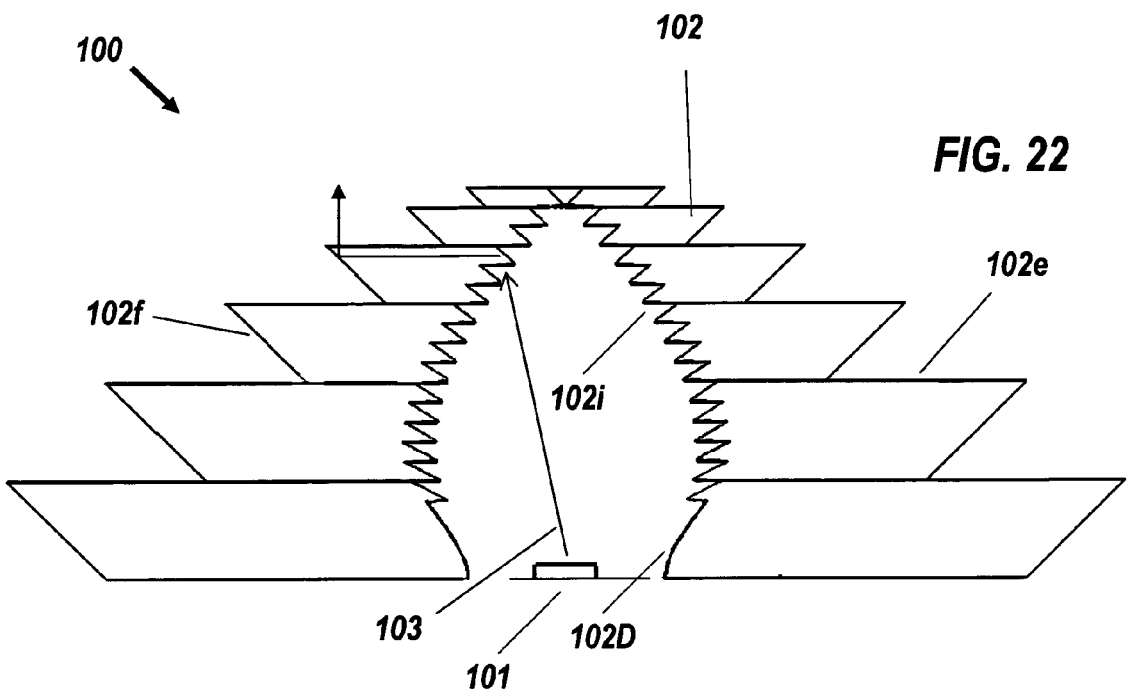
FIG. 22 shows an embodiment similar to one shown in the above-referenced U.S. Pat. No. 7,006,306 to Falicoff et al.

FIG. 22 shows collimating system 100, similar to one shown in the Falicoff '306 patent, comprising LED source 101 and collimating lens 102. Exemplary ray 103 proceeds to faceted interior surface 102i in which the facets have horizontal lower surfaces and conically slanted upper surfaces. Ray 103 enters upwards through a lower surface, and is then totally internally reflected laterally by the associated conical surface, out to one of outer slanted surfaces 102f, which totally internally reflects ray 103 upward so it exits out horizontal surface 102e. Lens 102 also comprises refracting drum lens 102D that directs the lower rays horizontally to the lowest slanted surface 102f. The overall shape of lens 102 is such that source 101 subtends a nearly constant apparent angular diameter from the various positions on the interior surface 102i.

Figure 23:
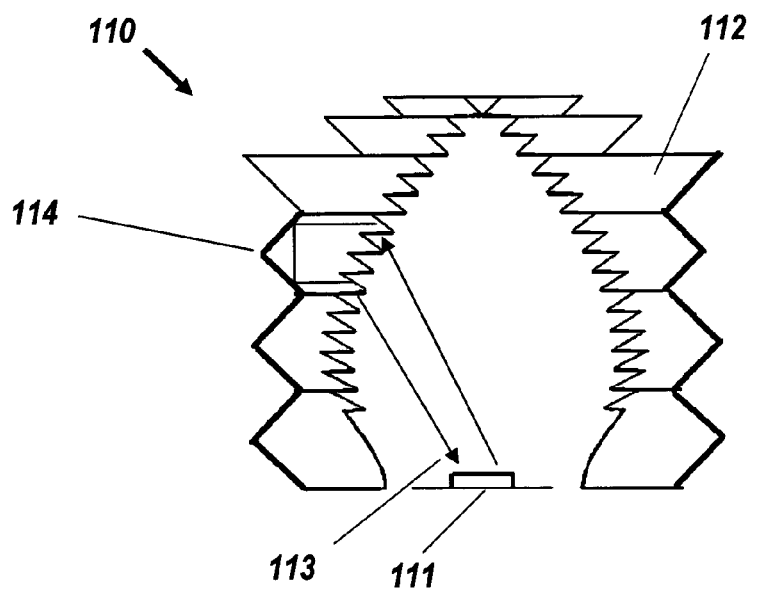
FIG. 23 shows the device of FIG. 22 truncated by retroreflectors.

FIG. 23 shows truncated collimating system 110, comprising LED source 111 and collimating lens 112. Rays striking the upper part of interior surface 102i are directed outward and upward as in FIG. 22. However, lower slanted surfaces 102f are replaced by pairs of facing slanted surfaces 114, forming retroreflective V-grooves. Exemplary rays 113 are directed outwards by interior surface 102i, as in FIG. 22, but retroreflective V-grooves turn them back so they can rejoin source 111. The grooves need no reflective coating. Lens 112 has the same beamwidth as lens 102 of FIG. 22, in spite of the smaller aperture.

Figure 24:
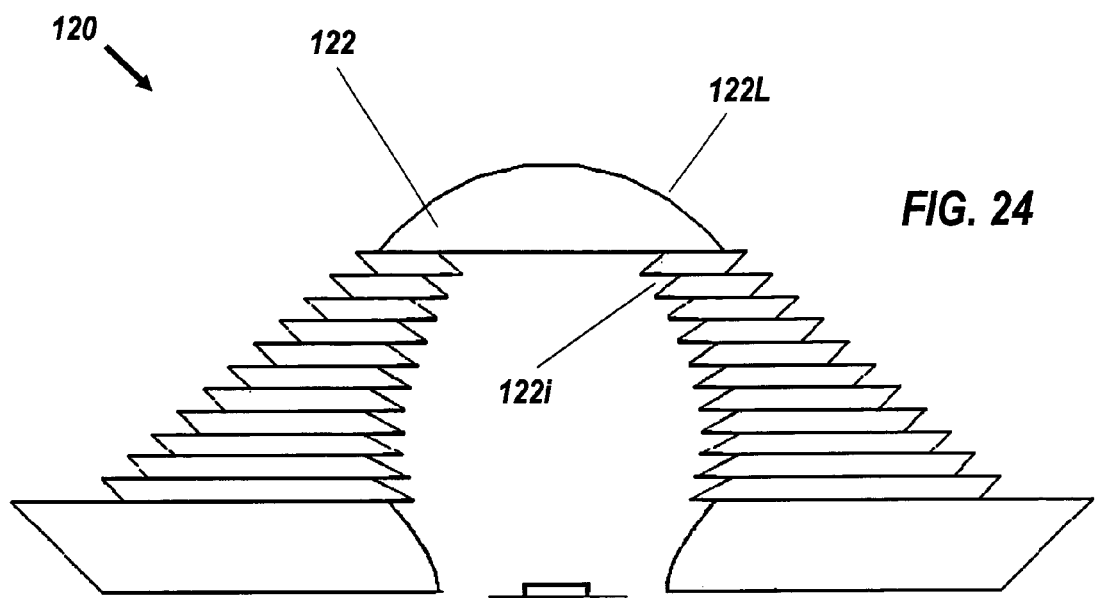
FIG. 24 shows a further embodiment similar to one shown in the Falicoff '306 patent.

FIG. 24 shows another embodiment, collimating system 120, which is similar to one shown in the Falicoff '306 patent, and comprises LED light source 121 and collimating lens 122, similar to lens 112 of FIG. 23 except for domed upper collimating lens 122L.

Figure 25:
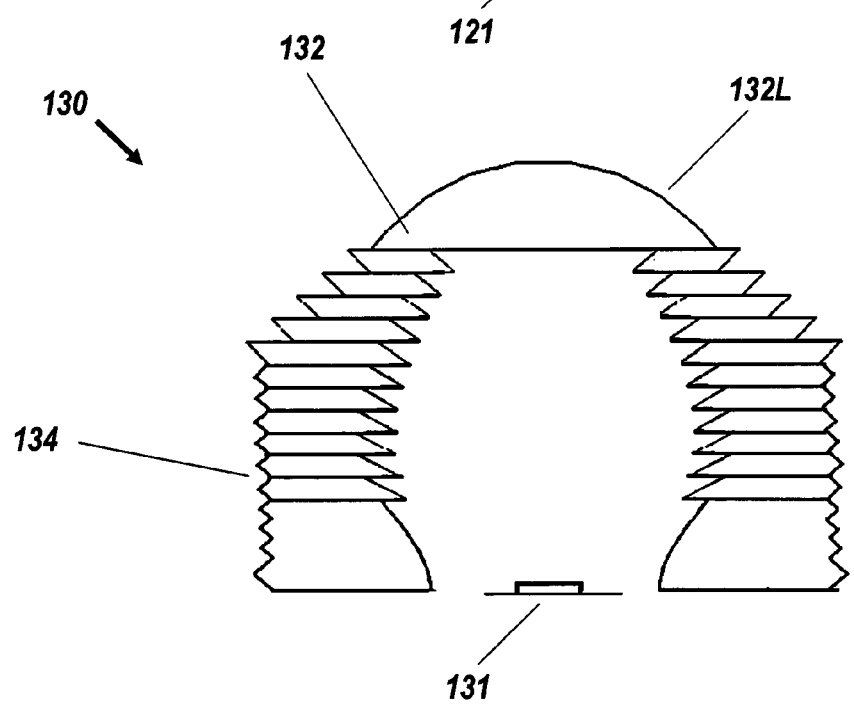
FIG. 25 shows the device of FIG. 24 truncated by V-groove retroreflectors.

FIG. 25 shows truncated collimating system 130, also comprising retroreflecting lateral V-grooves 134, which cause light to be returned to LED light source 131.

Figure 26:
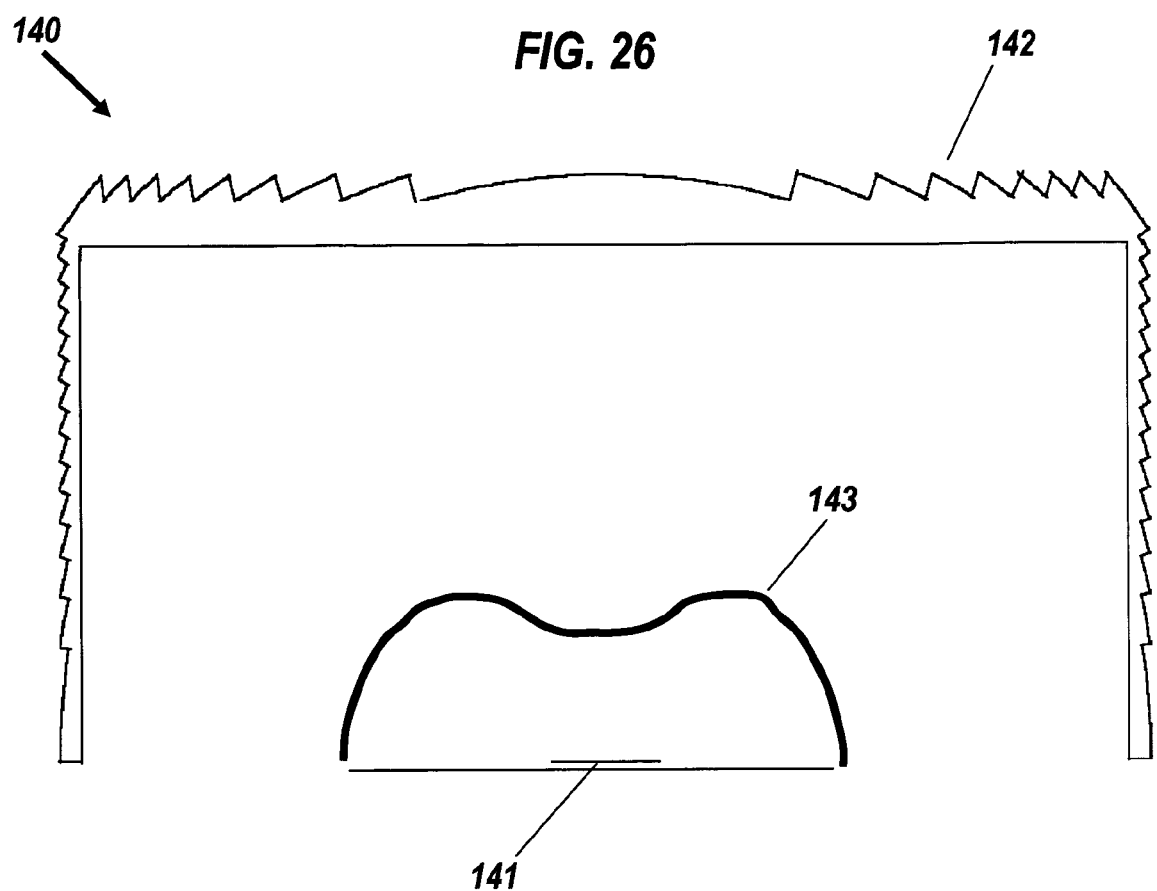
FIG. 26 shows a device similar to that of FIG. 11, but with a mushroom lens to reduce beamwidth.

FIG. 26 shows a luminaire similar to that of FIG. 11, but with the addition of mushroom lens 143, the central concavity of which acts as a negative lens to demagnify the image of LED light source 141 and thereby reduce output beamwidth from its étendue-limited value.

Figure 27:
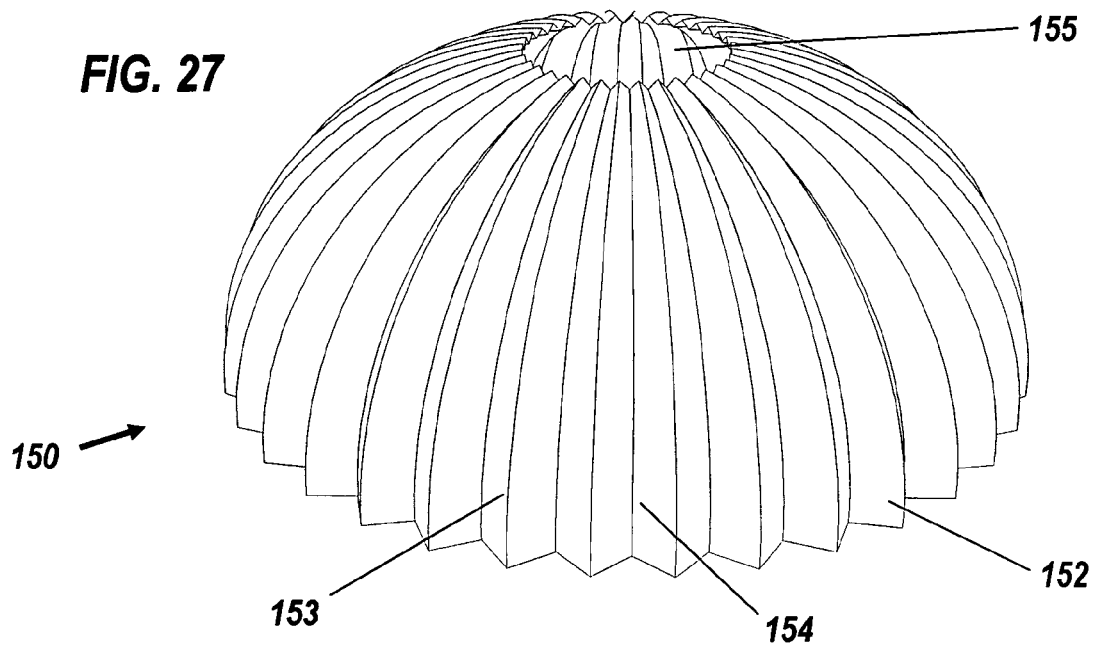
FIG. 27 shows an elliptical reflector made of a micro linear retroreflector material whose grooves are curves normal to the flowlines.

FIG. 27 shows elliptic reflector 150 made of micro linear retroreflectors 152 whose grooves are lines normal to the flowlines, either ridges 153 or valleys 154. Light striking anywhere on the interior of reflector 150 is retroreflected by the two facets either side of a ridge 153. Luminance enhanced light exits through central aperture 155. The inner part of the retroreflectors is a dielectric with a refractive index high enough to produce retroreflection by TIR of the rays coming from the LED surface or other suitable source. The whole elliptic cavity can be filled by a dielectric or the reflector can include another elliptic cavity filled with air (n=1). In this latter case the inner surface is elliptic without micro grooves. Such micro linear retroreflectors can be used in any surface generated from curves normal to the flowlines and not only in the elliptical cavity, at least if the flowlines intersected by each such curve form a plane surface. That is the case for the meridian ellipses of FIG. 1, where the flowlines intersecting each meridian form a radial and axial plane containing the meridian in question. The advantage of using such linear retroreflectors is that the reflectivity can increase as the metallization process can be avoided. Note that in general the reflecting surfaces containing flowlines can work by TIR.

To calculate the surface of the micro linear reflectors the following procedure can be used: Let P=C(u) be the parametric equation of the line normal to the flowlines (u is the parameter along the curve). Let $t_p$ be the unit tangent to the curve at P and let $j_p$ be the unit tangent to the flowline passing through P. Note that $j_p \cdot t_p = 0$ (i.e., these 2 vectors are perpendicular). The 2 slopes of the groove are given by the following parametric equations: $P=C(u)+v(j_p \pm j_p \times tp)$ where × denotes the cross product of two vectors and where u and v are the parameters on the surface. Both vectors $j_p$ and $t_p$ depend on the parameter u. This surface coincides with the surface normal to the flowlines at least at v=0. Each side of the groove is limited by its intersection with its neighbor groove. If the surface is not too big, the local behavior of the groove is that of a linear retroreflector with axis $t_p$.

These retroreflectors are different from those shown in FIG. 23, the retroreflectors 114 shown in FIG. 23 having rotational symmetry.

Figure 28:
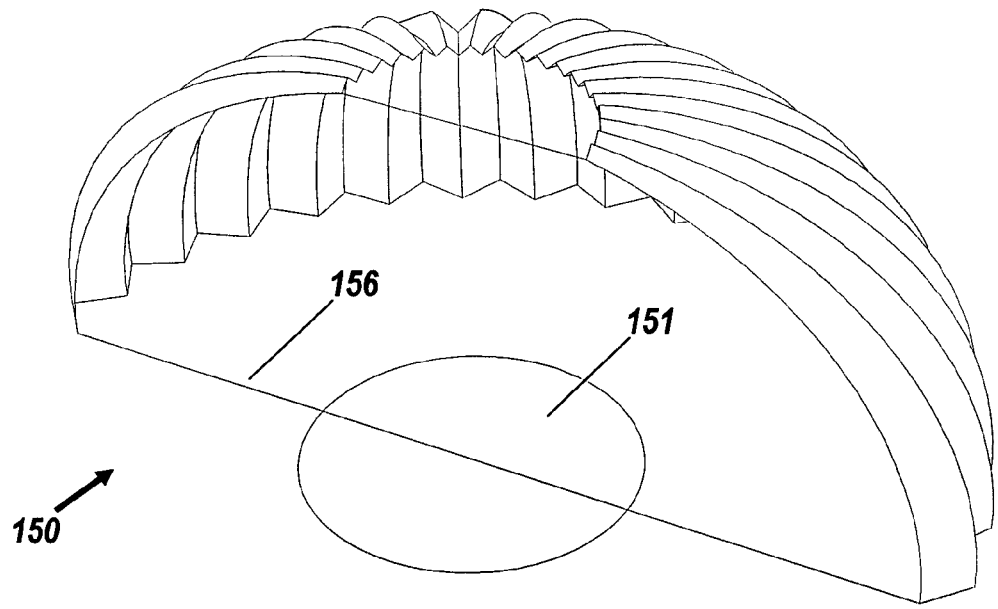
FIG. 28 shows a cross section of an elliptical retroreflector with micro linear retroreflector normal to the flowlines.

FIG. 28 shows a cutaway view of elliptic reflector 150, cut by a meridian plane to reveal disc source 151, with diameter 156 revealing that the bottom of reflector 150 is coplanar with source 151, which as previously is diffusely reflecting to recycle the light returned by reflector 150.

It is desirable that the reflectance of the retro-reflectors be as high as possible in order to achieve a significant boost in brightness and at the same time maintain a high efficiency. It is well known in the thin film industry how to achieve high reflectance using multi-dielectric coatings or hybrid metal/dielectric coatings (where the metal is either aluminum or silver) when the reflector operates with the incident and reflected rays in air, and a solid support on the inactive side of the coating. These so-called first surface reflectors can be designed to operate within a certain range of ray incidence angles and wavelengths. However, prior art is limited with regard to high performance designs for second surface reflectors that are needed for efficient implementation of many of the embodiments in this invention, such as the design of FIG. 18. The typical prior art design only achieve an average reflectance of 90%. The following thin film design shown in Table 3 addresses this issue and provides a formula for an omni-directional second surface reflector having a reflectance in the visible and near infrared range of over 95%.

The key principle used to design this reflector is revealed in U.S. utility application Ser. No. 11/982,492 "Wideband Dichroic-Filter Design for LED-Phosphor Beam-Combining" filed on Nov. 2, 2007 (by one of the Inventors of this invention), which is incorporated herein by reference in its entirety. In order to increase the reflectance an initial low index layer such as silicon dioxide is used as the first layer of a stack applied to the dielectric medium of the optic. The thickness of this layer should be no less than two times the shortest wavelength of light source that needs to be highly reflected. A nominal thickness of 1000 nm to 1100 nm works well for visible light sources. This thickness is later optimized using a thin film design software package such as Essential Macleod once a merit matrix is established for the design. A preferred design is shown in the following table starting from the dielectric medium (assumed to be acrylic) backwards towards air. The materials are in order of deposition on the second surface, Silicon Dioxide, Tantalum Pentoxide, Silicon Dioxide, Silver, Copper (protects silver from degradation), Inconel (a proprietary metal of Special Metals Corporation of New Hartford, N.Y. The last layer protects the silver and copper layers. The overall thickness of the stack is just under 1.7 microns. Note that the first Silicon Dioxide layer is slightly under 1100 nm.

TABLE 3

Design: second surface
Reference Wavelength (nm): 530
Incident Angle (deg): 0

| Layer | Material | Packing Density | Refractive Index | Extinction Coefficient | Optical Thickness (FWOT) | Physical Thickness (nm) | Geometric Thickness |
|---|---|---|---|---|---|---|---|
| Medium | Acrylic |  | 1.49472 | 0 |  |  |  |
| 1 | SiO2 | 1 | 1.46085 | 0 | 2.965255 | 1075.8 | 2.029818 |
| 2 | Ta2O5 | 1 | 2.02 | 0 | 0.974106 | 255.58 | 0.482231 |
| 3 | SiO2 | 1 | 1.46085 | 0 | 0.161577 | 58.62 | 0.110605 |
| 4 | Ag | 1 | 0.053 | 3.14 | 0.01925 | 192.5 | 0.363211 |
| 5 | Cu | 1 | 0.754 | 2.7675 | 0.06965 | 48.96 | 0.092375 |
| 6 | Ni | 1 | 1.821 | 3.211 | 0.171414 | 49.89 | 0.094132 |
| Substrate | Air |  | 1 | 0 |  |  |  |
| Total Thickness |  |  |  |  | 4.361252 | 1681.36 | 3.172371 |

Figure 29:
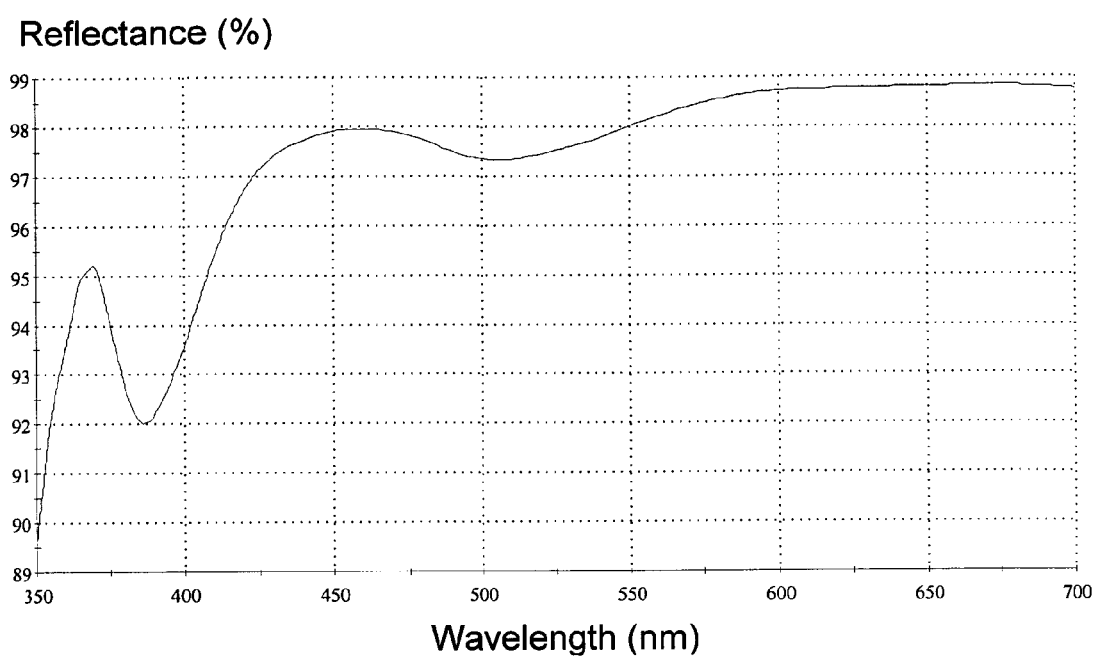
FIG. 29 shows the reflectance as a function of wavelength of a second surface thin film reflector at 0° incidence angle.

The reflectance values (for the mean polarization state) were set to 1.0 for all wavelengths from 420 nm to 700 nm in the Macleod target matrix. FIG. 29 shows graph 160 which gives the % reflectance (vertical axis) of the second surface thin film reflector at 0° incidence angle for the wavelength (horizontal axis) band from 350 nm to 700 nm. The reflectance starts at 95% for 410 nm and is above 97% for all wavelengths from about 425 nm up to 700 nm. A slightly higher performance is possible by employing conjugate gradient optimization or other forms of optimization known to those skilled in art of thin film design. For maximum performance a range of incidence angles and wavelengths should be used as the merit function. If more alternating layers of Silicon Dioxide and Tantalum Pentoxide are added to the design, the reflectance can be further increased to above 99% reflectance for a wide range of incidence angles and wavelengths. For high incidence angles (above the critical angle) the reflectance is theoretically 100% as the thick layer of Silicon Dioxide reflects light via total internal reflection.

Figure 30:
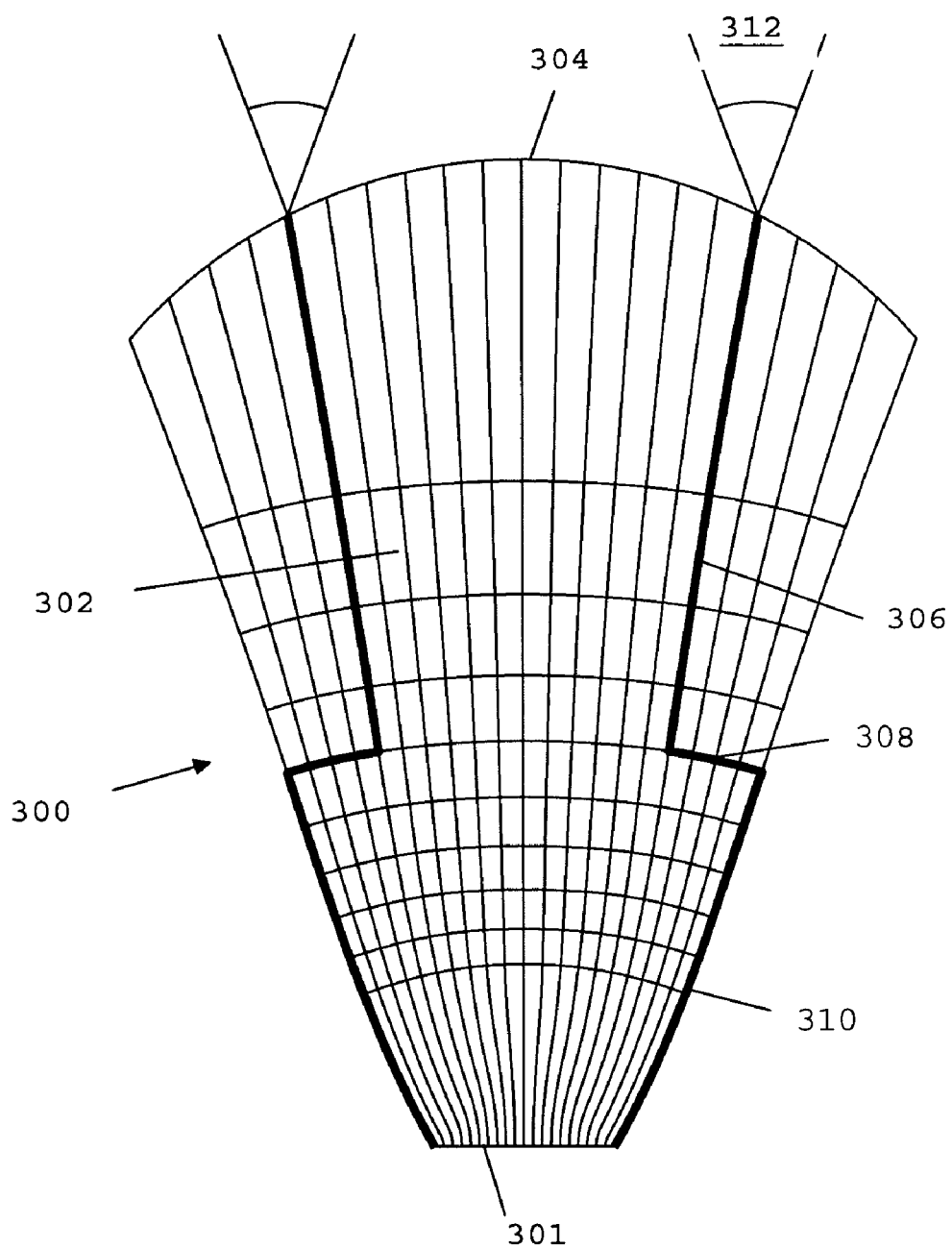
FIG. 30 shows a family of flowlines and ortho-flowlines in a further embodiment of a luminaire, showing the boundary lines for a two-tier retroreflector drawn to scale.

FIG. 30 shows, in an axial cross-section view similar to FIG. 16, a set of flowlines and ortho-flowlines for a further embodiment of a luminaire 300. The luminaire 300 comprises a light source 301 and a collimating and retroreflecting optic 302, bounded by a refractive exit surface 304 and reflective side surfaces 306, 308, 310. The surfaces are surfaces of revolution of the lines shown in FIG. 30 about a central axis. Reflective surface 306 extends along a flowline from the edge of the refractive exit surface 304 towards the source 301. Retroreflective surface 308 extends along an ortho-flowline from the proximal end of the reflective surface 306 towards the axis of luminaire 300. Reflective surface 310 extends along a flowline from the inner edge of reflective surface 308 to the periphery of source 301.

In order to show the geometry more clearly, the flowline on which surface 310 lies and the exit surface 304 have been extended to meet. These extended lines delineate a notional conventional collimating luminaire, with which the luminaire 300 of FIG. 30 may be compared. The retroreflective surface 308 permits the size of the exit aperture 304, and the overall size of the optic 302 to be reduced relative to the notional comparison luminaire, while maintaining the angular beamwidth 312 equal to that of the notional comparison luminaire.

The shapes of the active surfaces of optic 302 are shown in Tables 4 and 5 as a series of plots of x,y coordinates along each of the lines 304, 306, 308, 310, taking the plane of the source 301 as y=0 and the central axis as x=0.

TABLE 4

| Exit surface 304 | | Flowline 306 | |
|---|---|---|---|
| x | y | x | y |
| 0.002843 | 5.581988 | 1.306941 | 5.263837 |
| 0.045264 | 5.581627 | 1.288433 | 5.159707 |
| 0.090516 | 5.580546 | 1.270654 | 5.059171 |
| 0.135746 | 5.578745 | 1.253555 | 4.962001 |
| 0.180941 | 5.576225 | 1.237094 | 4.867987 |
| 0.22609 | 5.572985 | 1.221229 | 4.776939 |
| 0.271182 | 5.569027 | 1.205925 | 4.688679 |
| 0.316206 | 5.564351 | 1.191148 | 4.603044 |
| 0.361149 | 5.55896 | 1.176865 | 4.519884 |
| 0.406 | 5.552853 | 1.163049 | 4.43906 |
| 0.450749 | 5.546034 | 1.149673 | 4.360443 |
| 0.495384 | 5.538503 | 1.136711 | 4.283913 |
| 0.539893 | 5.530262 | 1.124141 | 4.20936 |
| 0.584265 | 5.521314 | 1.111942 | 4.13668 |
| 0.628489 | 5.511661 | 1.100093 | 4.065779 |
| 0.672554 | 5.501305 | 1.088577 | 3.996566 |
| 0.716448 | 5.490249 | 1.077376 | 3.928959 |
| 0.760161 | 5.478496 | 1.066473 | 3.86288 |
| 0.803681 | 5.466048 | 1.055854 | 3.798258 |
| 0.846998 | 5.452909 | 1.045505 | 3.735023 |
| 0.890099 | 5.439082 | 1.035413 | 3.673113 |
| 0.932976 | 5.424571 | 1.025565 | 3.612469 |
| 0.975616 | 5.409379 | 1.01595 | 3.553035 |
| 1.018008 | 5.39351 | 1.006556 | 3.49476 |
| 1.060143 | 5.376969 | 0.997375 | 3.437594 |
| 1.102009 | 5.359758 | 0.988395 | 3.381493 |
| 1.143596 | 5.341884 | 0.979609 | 3.326412 |
| 1.184893 | 5.32335 | 0.971007 | 3.272312 |
| 1.225889 | 5.30416 | 0.962582 | 3.219154 |
| 1.266576 | 5.284321 | 0.954326 | 3.166903 |
| 1.306941 | 5.263837 | 0.946232 | 3.115526 |
| | | 0.938293 | 3.064991 |
| | | 0.930502 | 3.015267 |
| | | 0.922855 | 2.966327 |
| | | 0.915344 | 2.918145 |
| | | 0.907964 | 2.870695 |
| | | 0.900711 | 2.823954 |
| | | 0.89358 | 2.7779 |
| | | 0.886565 | 2.732512 |
| | | 0.879662 | 2.687769 |
| | | 0.872867 | 2.643654 |
| | | 0.866176 | 2.600149 |
| | | 0.859586 | 2.557237 |
| | | 0.853092 | 2.514903 |
| | | 0.84669 | 2.473131 |

TABLE 4-continued

| Exit surface 304 | | Flowline 306 | |
|---|---|---|---|
| x | y | x | y |
| | | 0.840379 | 2.431908 |
| | | 0.834153 | 2.39122 |
| | | 0.828011 | 2.351055 |
| | | 0.82195 | 2.311401 |
| | | 0.815965 | 2.272247 |
| | | 0.810056 | 2.233582 |

TABLE 5

| Ortho-flowline 308 | | Flowline 310 | |
|---|---|---|---|
| x | y | x | y |
| 0.810056 | 2.233582 | 1.318804 | 2.114914 |
| 0.821841 | 2.23176 | 1.318039 | 2.112537 |
| 0.833573 | 2.229906 | 1.299096 | 2.053679 |
| 0.845251 | 2.228019 | 1.280508 | 1.995877 |
| 0.856875 | 2.2261 | 1.262239 | 1.939055 |
| 0.868444 | 2.224151 | 1.244258 | 1.883153 |
| 0.879957 | 2.222171 | 1.226536 | 1.828115 |
| 0.891412 | 2.220161 | 1.209048 | 1.773899 |
| 0.90281 | 2.218122 | 1.191774 | 1.72047 |
| 0.914149 | 2.216054 | 1.174693 | 1.667798 |
| 0.925428 | 2.213959 | 1.157788 | 1.615861 |
| 0.936646 | 2.211836 | 1.141046 | 1.564641 |
| 0.947804 | 2.209686 | 1.124452 | 1.514124 |
| 0.958899 | 2.20751 | 1.107994 | 1.464301 |
| 0.969931 | 2.205309 | 1.091664 | 1.415165 |
| 0.980899 | 2.203083 | 1.075451 | 1.366713 |
| 0.991802 | 2.200833 | 1.059349 | 1.318943 |
| 1.00264 | 2.198559 | 1.04335 | 1.271858 |
| 1.013412 | 2.196263 | 1.027449 | 1.225458 |
| 1.024116 | 2.193945 | 1.011641 | 1.179749 |
| 1.034753 | 2.191605 | 0.995923 | 1.134734 |
| 1.045321 | 2.189244 | 0.980292 | 1.090421 |
| 1.055819 | 2.186863 | 0.964746 | 1.046815 |
| 1.066248 | 2.184463 | 0.949283 | 1.003925 |
| 1.076605 | 2.182044 | 0.933903 | 0.961757 |
| 1.086891 | 2.179607 | 0.918607 | 0.92032 |
| 1.097104 | 2.177153 | 0.903395 | 0.879622 |
| 1.107245 | 2.174682 | 0.888269 | 0.83967 |
| 1.117311 | 2.172195 | 0.873231 | 0.800472 |
| 1.127303 | 2.169693 | 0.858285 | 0.762036 |
| 1.13722 | 2.167177 | 0.843433 | 0.724369 |
| 1.14706 | 2.164647 | 0.828681 | 0.687479 |
| 1.156825 | 2.162103 | 0.814033 | 0.651372 |
| 1.166512 | 2.159548 | 0.799495 | 0.616055 |
| 1.176121 | 2.156981 | 0.785073 | 0.581534 |
| 1.185651 | 2.154402 | 0.770774 | 0.547814 |
| 1.195103 | 2.151814 | 0.756606 | 0.5149 |
| 1.204475 | 2.149216 | 0.742576 | 0.482797 |
| 1.213767 | 2.14661 | 0.728694 | 0.451508 |
| 1.222977 | 2.143995 | 0.714968 | 0.421039 |
| 1.232107 | 2.141373 | 0.70141 | 0.391391 |
| 1.241154 | 2.138745 | 0.688028 | 0.362567 |
| 1.250119 | 2.136111 | 0.674834 | 0.334571 |
| 1.259 | 2.133471 | 0.661839 | 0.307403 |
| 1.267798 | 2.130828 | 0.649057 | 0.281066 |
| 1.276512 | 2.12818 | 0.636498 | 0.255561 |
| 1.285142 | 2.12553 | 0.624176 | 0.230888 |
| 1.293686 | 2.122877 | 0.612105 | 0.207049 |
| 1.302145 | 2.120223 | 0.600299 | 0.184045 |
| 1.310517 | 2.117568 | 0.58877 | 0.161875 |
| 1.318804 | 2.114914 | 0.577535 | 0.14054 |
| | | 0.566607 | 0.120041 |
| | | 0.556001 | 0.100377 |
| | | 0.545734 | 0.081551 |

TABLE 5-continued

| Ortho-flowline 308 | | Flowline 310 | |
|---|---|---|---|
| x | y | x | y |
|  |  | 0.53582 | 0.063561 |
|  |  | 0.526274 | 0.04641 |
|  |  | 0.517112 | 0.030098 |
|  |  | 0.508349 | 0.014627 |
|  |  | 0.5 | −1.89E−15 |

The preceding description of presently contemplated modes of practicing the invention is not to be taken in a limiting sense, but is made merely for the purpose of describing the general principles of the invention.

For example, the source of radiation has been described in the embodiments as a flat, square or circular, light emitting diode (LED). LED sources are described because LED sources with the desired properties, including high luminous efficiency and diffuse reflectance of light of the same frequencies as the light emitted, are readily obtainable from commercial sources. However, other light sources currently available or to become available in the future may be used instead. Flat, square or circular sources are described in the embodiments because LED sources with that configuration are readily obtainable from commercial sources, and because the resulting geometrical simplicity of the examples is believed to aid in understanding of the underlying principles. However, light sources of other shapes may be used.

For example, some embodiments have been described with reference to the orientation shown in the drawings, using relative language such as "top" and "bottom." However, the described luminaires may be used in other orientations.

The full scope of the invention should be determined with reference to the claims.

The following additional U.S. Patent documents are believed to be relevant to understanding of the invention, and are incorporated herein by reference in their entirety.

U.S. Pat. No. 5,684,354 to Gleckman
U.S. Pat. No. 5,892,325 to Gleckman
U.S. Pat. No. 6,043,591 to Gleckman
U.S. Pat. No. 6,496,237 to Gleckman
U.S. Pat. No. 6,960,872 to Beeson & Zimmerman
U.S. Pat. No. 6,869,206 to Beeson & Zimmerman
U.S. Pat. No. 7,025,464 to Beeson & Zimmerman
U.S. Pat. No. 7,040,774 to Beeson & Zimmerman

What is claimed is:

1. A collimating luminaire comprising:
a light-source with a diffuse reflectivity exceeding one half, said collimating luminaire intercepting the emitted light of said source, said luminaire producing a substantially uniform beamwidth across its exit aperture, and
a system of specular retroreflectors comprising at least one concave retroreflector that returns part of said emitted light to said source, said retroreflectors allowing the removal of the outer part of said exit aperture, so that said exit aperture is smaller than the étendue-limited aperture for said beamwidth,
wherein part of said emitted light that is returned to said source by said system of retroreflectors is then returned towards said exit aperture by said diffuse reflectivity of said source.

2. A collimating luminaire comprising a light-source with a diffuse reflectivity exceeding one half, said luminaire defining an exit aperture and intercepting the emitted light of said source in directions outside the exit aperture, said luminaire comprising at least one at least approximately elliptically concave specular retroreflector that returns part of said emitted light to said source, wherein part of said emitted light that is returned to said source by said system of retroreflectors is then returned towards said exit aperture by said diffuse reflectivity of said source.

3. A collimating luminaire according to claim 2, wherein at least one focus of an ellipse defining the elliptically concave retroreflector is at least approximately at an edge of a beam of light that reaches the retroreflector from the source.

4. A collimating luminaire according to claim 3, wherein at least one focus of the ellipse is at least approximately at an edge of the light source.

5. A collimating luminaire according to claim 3, wherein at least one focus of the ellipse is at least approximately at an edge of an opaque object that cuts off the beam of light.

6. A collimating luminaire according to claim 5, which comprises at least a first said retroreflector defining an exit aperture and intercepting emitted light of said source in directions outside the exit aperture, and a second said retroreflector between the source and the first retroreflector defining a second aperture through which emitted light of said source reaches said first retroreflector and said exit aperture, said second retroreflector intercepting the emitted light of said source in directions outside the second aperture, and wherein at least one focus of the ellipse defining said first retroreflector is at least approximately at an edge of said second retroreflector.

7. A collimating luminaire comprising a light-source with a diffuse reflectivity exceeding one half, said luminaire defining an exit aperture and intercepting the emitted light of said source in directions outside the exit aperture, said luminaire comprising at least one at least approximately elliptically concave retroreflector that returns part of said emitted light to said source, and further comprising at least one forward reflector positioned to direct intercepted light through the exit aperture in such a manner as to produce a substantially uniform beamwidth across the exit aperture wherein the exit aperture is smaller than the étendue-limited aperture for said beamwidth.

8. A collimating luminaire according to claim 7, wherein at least one said forward reflector is at least approximately hyperbolically concave.

9. A collimating luminaire according to claim 8, wherein at least one focus of a hyperbola defining the hyperbolically concave forward reflector is at least approximately at an edge of a beam of light that reaches the forward reflector from the source.

10. A collimating luminaire according to claim 9, wherein at least one focus of the hyperbola is at least approximately at an edge of the light source.

11. A collimating luminaire according to claim 9, wherein at least one focus of the hyperbola is at least approximately at an edge of an opaque object that cuts off the beam of light.

12. A collimating luminaire according to claim 11, wherein at least one focus of the hyperbola is at least approximately at an edge of a said retroreflector between the source and the forward reflector.

13. A collimating luminaire comprising:
a light-source with a diffuse reflectivity exceeding one half, said collimating luminaire intercepting the emitted light of said source, said luminaire producing a substantially uniform beamwidth across its exit aperture, and
a system of forward reflectors comprising at least one said forward reflector lying along a flowline of the light from the source that directs part of said emitted light to said exit aperture, said system of reflectors allowing the removal of the outer part of said exit aperture, so that said exit aperture is smaller than the étendue-limited aperture for said beamwidth.

14. The collimating luminaire of claim 1 wherein said retroreflectors operate in air.

15. The collimating luminaire of claim 1 wherein said retroreflectors operate inside a dielectric.

16. The collimating luminaire of claim 15 wherein said retroreflectors reflect via means of micro-linear grooves.

17. The collimating luminaire of claim 15 wherein said retroreflectors reflect via means of a thin film stack.

18. The collimating luminaire of claim 17 wherein said thin film stack has an initial layer of a low index of refraction material with a thickness approximately equal to two times the nominal wavelength for stack.

19. A collimating luminaire according to claim 4, wherein the foci of the ellipse are at least approximately at the edges of the light source.

20. A collimating luminaire according to claim 1, wherein the at least one concave retroreflector lies along an ortho-flowline of the source.

* * * * *